(12) United States Patent
Miller et al.

(10) Patent No.: US 7,447,794 B1
(45) Date of Patent: Nov. 4, 2008

(54) SYSTEM AND METHOD FOR CONVEYING INFORMATION

(75) Inventors: Steven C. Miller, Livermore, CA (US); Thomas Edward McGee, Eau Claire, WI (US); Bruce Alan Strangfeld, Eau Claire, WI (US)

(73) Assignee: Silicon Graphics, Inc., Sunnyvale, CA (US)

( * ) Notice: Subject to any disclaimer, the term of this patent is extended or adjusted under 35 U.S.C. 154(b) by 653 days.

(21) Appl. No.: 10/310,400

(22) Filed: Dec. 4, 2002

(51) Int. Cl.
*G06F 15/16* (2006.01)
*G06F 13/00* (2006.01)

(52) U.S. Cl. .................. 709/232; 709/216; 709/229; 711/141

(58) Field of Classification Search .............. 709/213, 709/206, 216, 229, 232; 370/468; 710/1, 710/107, 305, 316; 711/141
See application file for complete search history.

(56) References Cited

U.S. PATENT DOCUMENTS

| | | | | |
|---|---|---|---|---|
| 4,438,494 A | * | 3/1984 | Budde et al. ................ | 714/2 |
| 4,814,984 A | * | 3/1989 | Thompson ................. | 709/209 |
| 5,528,761 A | * | 6/1996 | Ooba et al. ................ | 709/237 |
| 5,604,866 A | * | 2/1997 | Kolb et al. ................ | 709/235 |
| 6,256,677 B1 | * | 7/2001 | Pribnow et al. ............ | 709/250 |
| 6,662,213 B1 | * | 12/2003 | Xie et al. .................... | 709/206 |
| 6,751,698 B1 | * | 6/2004 | Deneroff et al. ........... | 710/317 |
| 6,938,091 B2 | * | 8/2005 | Das Sharma ............... | 709/230 |
| 7,103,672 B1 | * | 9/2006 | Sharma ...................... | 709/232 |
| 7,152,128 B2 | * | 12/2006 | Wehage et al. ............. | 710/305 |
| 7,231,486 B2 | * | 6/2007 | Ajanovic et al. ........... | 710/315 |
| 2003/0115513 A1 | * | 6/2003 | Harriman et al. ........... | 714/49 |
| 2005/0147057 A1 | * | 7/2005 | LaDue ....................... | 370/310 |

* cited by examiner

*Primary Examiner*—Saleh Najjar
*Assistant Examiner*—Vitali Korobov
(74) *Attorney, Agent, or Firm*—Baker Botts L.L.P.

(57) ABSTRACT

A system and method for conveying data include the capability to determine whether a transaction request credit has been received at a computer module, the transaction request credit indicating that at least a portion of a transaction request message may be sent. The system and method also include the capability to determine, if a transaction request message is to be sent, whether at least a portion of the transaction request message may be sent and to send the at least a portion of the transaction request message if it may be sent.

15 Claims, 6 Drawing Sheets

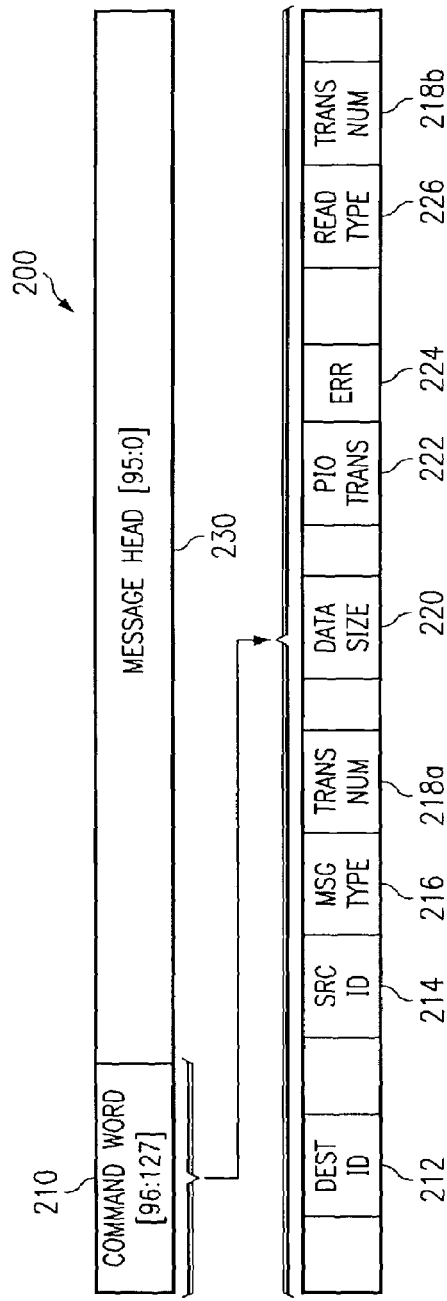
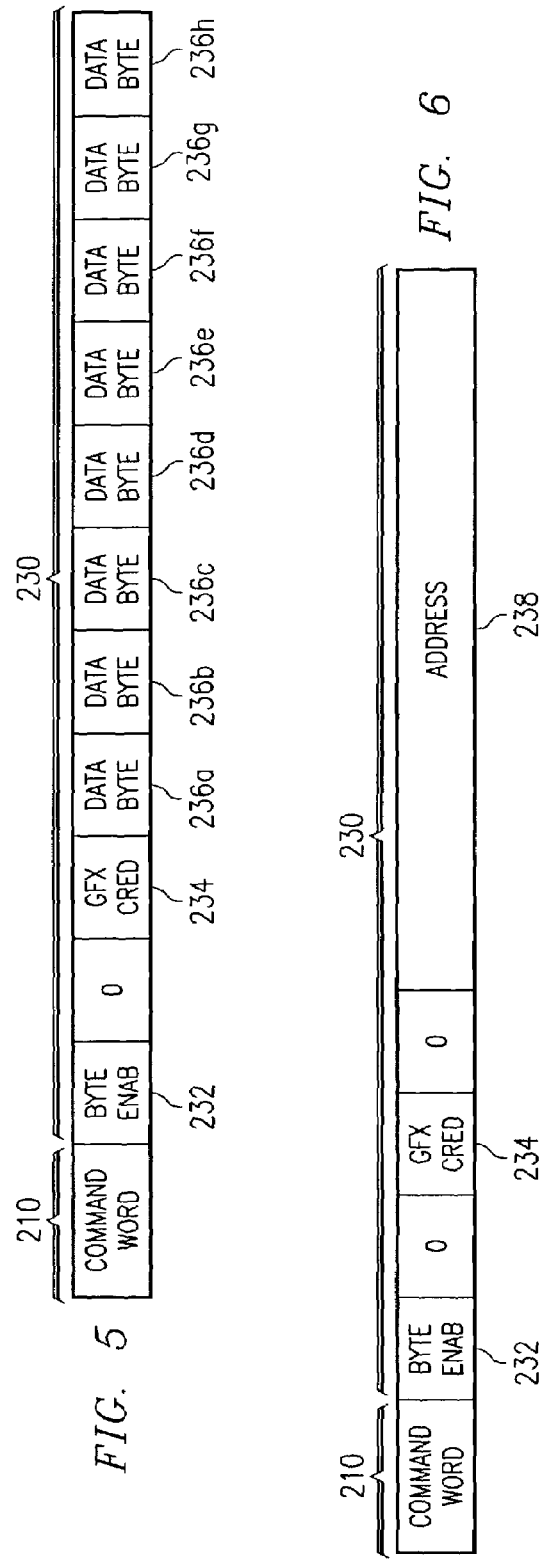

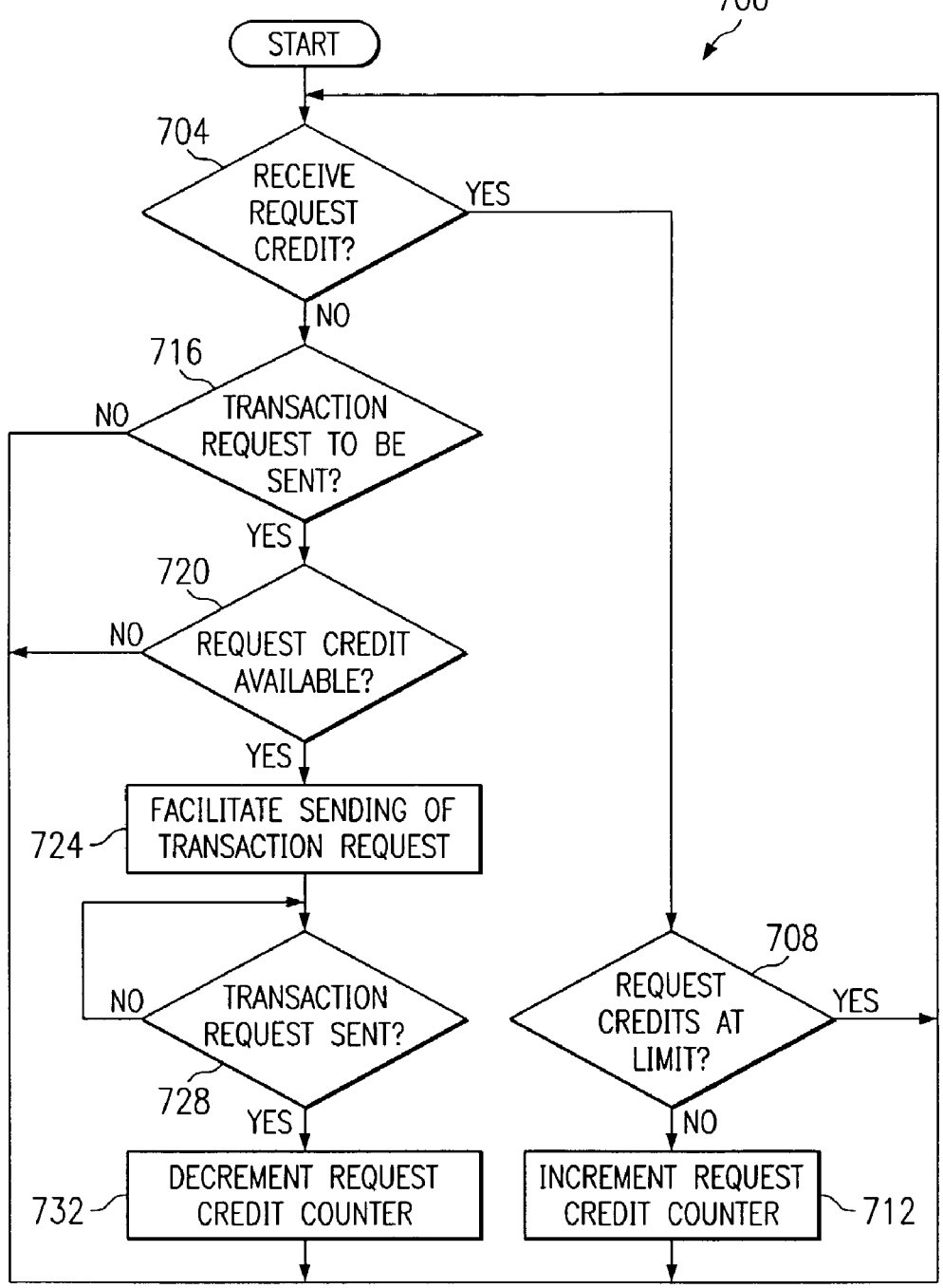

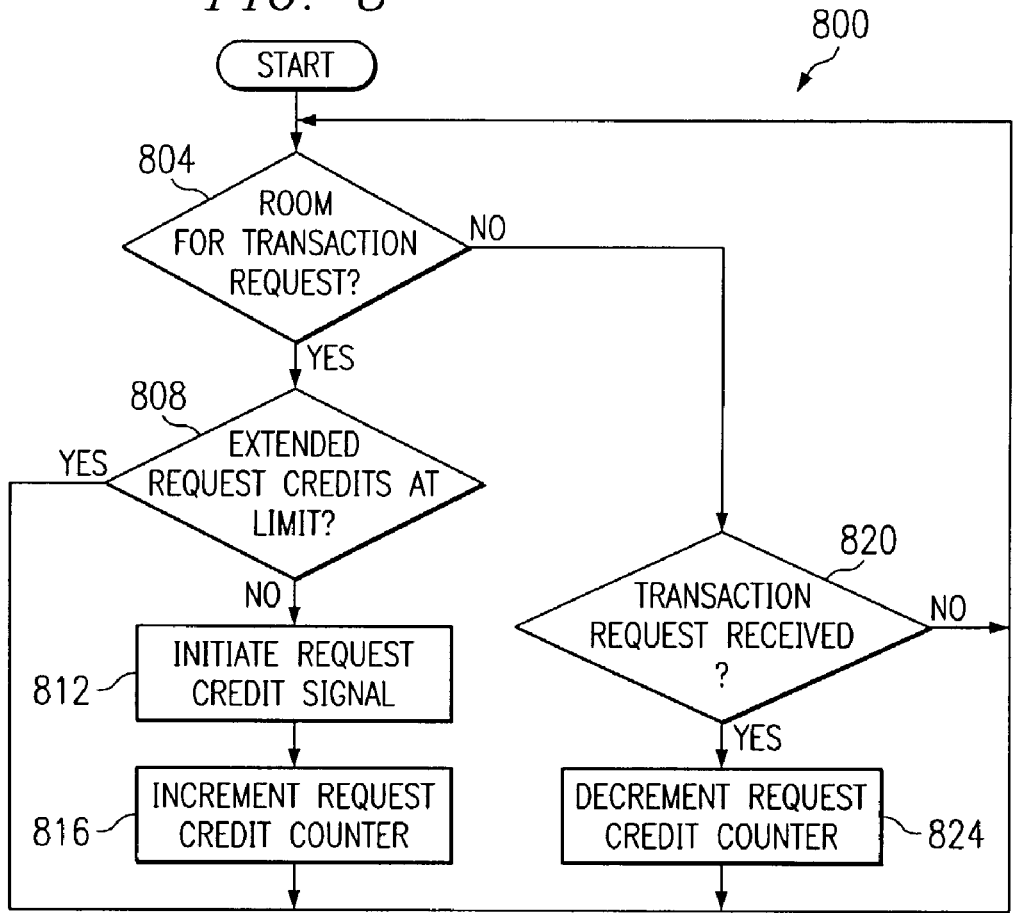

SYSTEM AND METHOD FOR CONVEYING INFORMATION

TECHNICAL FIELD OF THE INVENTION

The present invention relates to computer systems, and, more particularly, to a system and method for conveying information.

BACKGROUND OF THE INVENTION

As computers have become more and more powerful, they have acquired the ability to process more and more data. Furthermore, because they can process more and more data, computers need to be able to exchange data with other computers rapidly in order that they may operate efficiently. Moreover, computers that exchange data with each other often need to be able to determine the status of each other in order that they can exchange data properly and efficiently.

SUMMARY OF THE INVENTION

According to the present invention, a system and method for conveying information is provided. In particular embodiments, the system and method provide the ability to exchange processor input/output data and non-processor data and to execute atomic memory operations.

In certain embodiments, a method for conveying information includes determining whether a transaction request credit has been received at a computer module, the transaction request credit indicating that at least a portion of a transaction request message may be sent. The method also includes determining, if a transaction request message is to be sent, whether at least a portion of the transaction request message may be sent and sending the at least a portion of the transaction request message if it may be sent.

In particular embodiments, a method for conveying information includes determining, at a computer module, whether at least a portion of a transaction request message may be received. The method also includes sending, if at least a portion of a transaction request message may be received, a transaction request credit, the transaction request credit indicating that at least a portion of a transaction request message may be sent, and receiving a transaction request message.

The present invention has a variety of technical features. For example, in some embodiments, transaction request messages are only sent to a computer module after the computer module has indicated that it has available memory. Thus, transaction request messages should rarely, if ever, overflow. As another example, in certain embodiments, transaction response messages are only sent to a computer module after the computer module has indicated that it has available memory. Thus, transaction response messages should rarely, if ever, overflow. As an additional example, in particular embodiments, error correction codes associated with data may allow for the identification of single-bit, double-bit, and multi-bit errors, which provides improved protection against errors. Moreover, the error correction codes may allow for the correction of some errors. As a further example, in certain embodiments, cached reads of data may be performed, and the requesting computer module may be informed when the data is no longer valid.

Of course, some embodiments may possess none, one, some, or all of these technical features and/or additional technical features. Other technical features will be readily apparent to those skilled in the art from the following figures, written description, and claims.

BRIEF DESCRIPTION OF THE DRAWINGS

The drawings described below provide a more complete understanding of the present invention and its technical features, especially when considered in light of the following detailed written description:

FIG. 4 illustrates a message for conveying data in accordance with one embodiment of the present invention;

FIG. 5 illustrates another message for conveying data;

FIG. 6 illustrates yet another message for conveying data;

FIG. 7 is a flowchart illustrating a method for conveying data in accordance with one embodiment of the present invention; and FIG. 8 is a flowchart illustrating a method for conveying data in accordance with one embodiment of the present invention.

DETAILED DESCRIPTION OF THE INVENTION

Figure 1:
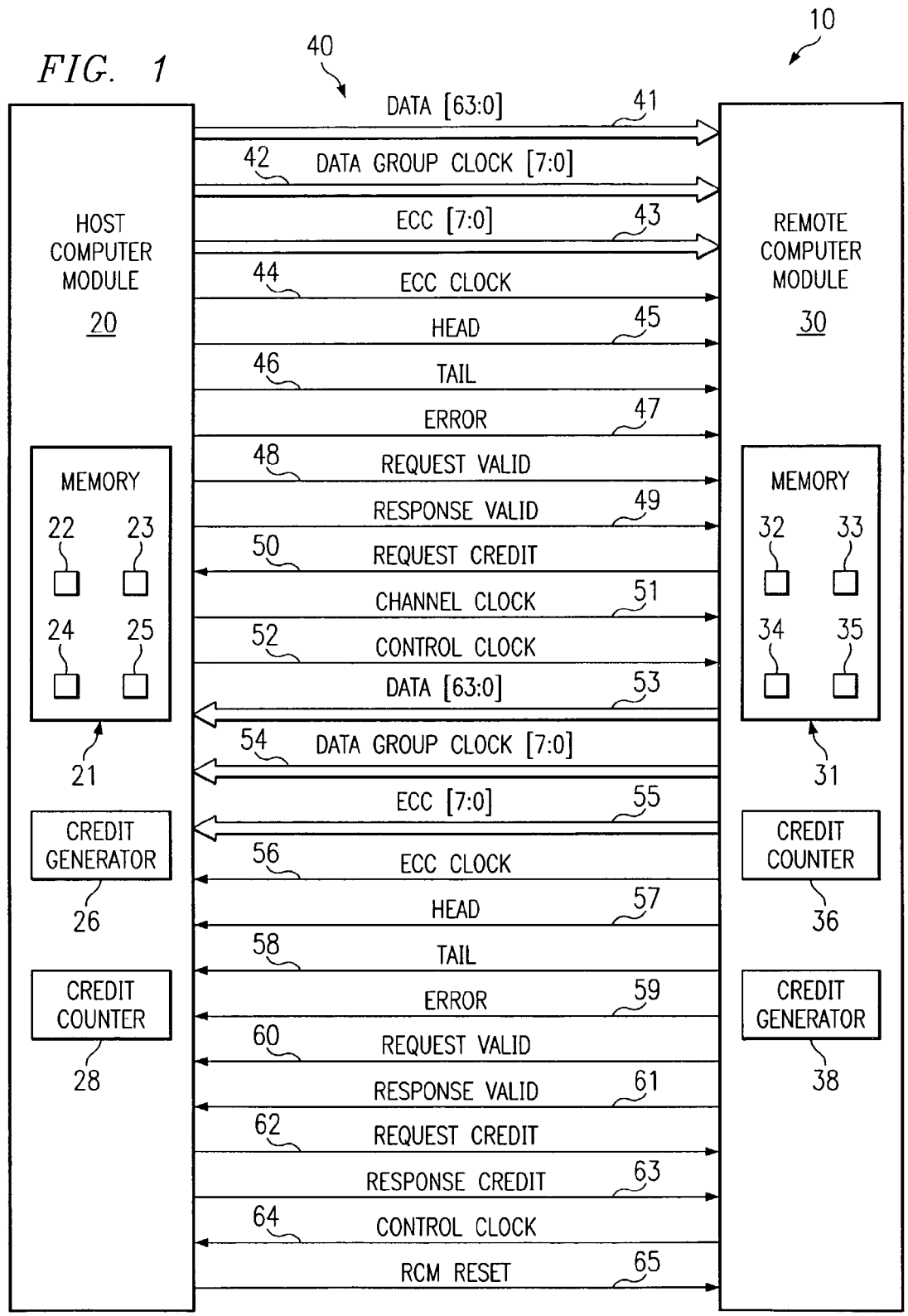
FIG. 1 illustrates one embodiment of a system for conveying data in accordance with the present invention.

FIG. 1 illustrates one embodiment of a system 10 for conveying information in accordance with the present invention. In general, system 10 includes a host computer module 20 and a remote computer module 30, which each typically include a memory and a processor. In addition, system 10 includes a signal transport device 40 coupled between host computer module 20 and remote computer module 30. Signal transport device 40 is responsible for conveying information between host computer module 20 and remote computer module 30. Information may include computer module status data, graphics data, general data, computer module commands, and/or any other appropriate type of computer module information.

In more detail, host computer module 20 includes a memory 21, a credit generator 26, and a credit counter 28. Memory 21 stores data regarding the status of host computer module 20, data to be conveyed to remote computer module 30, messages from remote computer module 30, the messages containing graphics data, commands, and/or status data for host computer module 20, and/or any other appropriate type of information. To accomplish this, memory 21 includes a status data portion 22, a data portion 23, a transaction request message buffer portion 24, and a transaction response message buffer portion 25. In other embodiments, however, memory 21 may have any number and/or arrangement of portions. Memory 22 may include read-only memory (ROM), random-access memory (RAM), compact-disc read-only memory (CD-ROM), registers, and/or any other type of electromagnetic or optical volatile or non-volatile information storage device. Credit generator 26, which will be discussed in more detail below, is responsible for informing remote computer module 30 when host computer module 20 is able to receive at least a portion of a certain type of message from remote computer module 30. Credit counter 28, in contrast, which will also be discussed in more detail below, is responsible for tracking how many of at least a portion of a certain type of message may be sent from host computer module 20 to remote computer module 30. Credit generator 26 and credit counter 28 may be implemented by logic encoded in a computer readable medium, an application-specific integrated circuit (ASIC), a field programmable gate array (FPGA), or any other appropriate type of software or hardware. Host computer module 20 may include any appropriate type of processor for accessing and/or coordinating the functions of memory 21, credit counter 26, and credit generator 28.

Remote computer module 30, in turn, includes a memory 31, a credit counter 36, and a credit generator 38. Memory 31 stores data regarding the status of remote computer module 30, data to be conveyed to host computer module 20, messages from host computer module 20, the messages containing graphics data, commands, and/or status data for remote computer module 30, and/or any other appropriate type of information. To accomplish this, memory 31 includes a status data portion 32, a data portion 33, a transaction request message buffer portion 34, and a transaction response message buffer portion 35. In other embodiments, however, memory 31 may have any number and/or arrangement of portions. Memory 31 may include ROM, RAM, CD-ROM, registers, and/or any other appropriate type of electromagnetic or optical volatile or non-volatile information storage device. Credit counter 36, to be discussed in more detail below, is responsible for tracking how many of at least a portion of a certain type of message may be sent from remote computer module 30 to host computer module 20. Credit generator 38, in contrast, also to be discussed in more detail below, is responsible for informing host computer module 20 when remote computer module 30 is able to receive at least a portion of a certain type of message from host computer module 20. Credit counter 36 and credit generator 38 may be implemented in logic encoded in a computer-readable medium, an ASIC, an FPGA, or any other appropriate type of software or hardware. Remote computer module 30 may include any appropriate type of processor for accessing and/or coordinating the functions of memory 31, credit counter 36, and credit generator 38.

In particular embodiments, remote computer module 30 may be a Coretalk Module and host computer module 20 may be an SGI™ Host Computer Module. In certain embodiments, signal transport device 40 allows remote computer module 30 to directly communicate with SGI™ computer systems that support the SGI™ NUMAlink™ network cabling system. In some embodiments, host computer module 20 may maintain memory coherency between the SGI™ computer system and remote computer module 30 and converts between the NUMAlink™ protocol, which is used in the SGI™ computer system, and the protocol used on signal transport device 40.

As mentioned previously, signal transport device 40 allows for the exchange of messages, which may contain status data, data, commands, and/or any other appropriate type of information, between host computer module 20 and remote computer module 30. In the illustrated embodiment, signal transport device 40 is a bus that includes 179 links, denoted by 41-65. In other embodiments, however, signal transport device 40 may have any number of links or may be any other appropriate type of device for conveying information. Links 41-65 may be wires, lines, pins, cables, and/or any other type of electrical conductors including the use of wireless or optical medium.

Link set 41 includes sixty-four links for conveying information from host computer module 20 to remote computer module 30. Thus, link set 41 is physically 64-bits wide. In other embodiments, however, link set 41 may have any appropriate width. In particular embodiments, link set 41 supports conveying information a double data rate (DDR). Thus, as illustrated, link set 41 may allow 128-bits of information to be conveyed during each period of the channel clock, one transfer occurring during the rising edge of the channel clock and the other transfer occurring during the falling edge of the channel clock. Link set 53 is similar to link set 41 except that it conveys information from remote computer module 30 to remote computer module 20.

The transfer of information between host computer module 20 and remote computer module 30 is timed by a signal on channel clock link 51. In other embodiments, however, the signals may be timed in any of a variety of other manners. As illustrated, link 51 conveys a channel clock signal from host computer module 20 to remote computer module 30. The channel clock signal may allow remote computer module 30 to operate in a phase-locked manner with host computer module 20. In particular embodiments, the channel clock signal is a 400 MHz differential signal sourced by host computer module 20.

Link set 42 is responsible for conveying clock signals associated with the information transferred on link set 41. These clock signals allow host computer module 20 and remote computer module 30 to maintain skew across the 64-bit information signals on link set. In embodiments where information is conveyed on link set 41 according to DDR, clock signals are also sent on link set 42 according to DDR. In particular embodiments, the first clock signal is associated with the first eight information links, the second clock signal is associated with the second eight information links, the third clock signal is associated with the third eight information links, the fourth clock signal is associated with the fourth eight information links, the fifth clock signal is associated with the fifth eight group of information links, the sixth clock signal is associated with the sixth eight information links, the seventh clock signal is associated with the seventh eight information links, and the eighth clock signal is associated with the eighth eight information links. Link set 54 is responsible for conveying similar signals for the information transferred on link set 53.

Link set 43 is responsible for conveying Error Correction Code (ECC) signals associated with the information conveyed by link set 41. In general, an ECC may be used to detect, report, and/or correct single-bit errors, double-bit errors, and/or multi-bit errors. In certain embodiments, to be discussed in more detail below, remote computer module 30 may uses the signals conveyed by link set 43 to detect and correct single-bit errors, detect and report double-bit errors, and detect and report at least some multiple-bit errors. In embodiments where information is transferred using DDR, the signals on links set 43 are also sent according to DDR, resulting in sixteen ECC signals being sent during each period in the illustrated embodiment. Link set 55 is responsible for conveying similar signals for the information transferred on link set 53.

Link 44 is responsible for conveying clock signals for the ECC signals conveyed on link set 43. Host computer module 20 and remote computer module 30 use the signals conveyed over link 44 to maintain skew across the signals conveyed over link set 43. In embodiments where signals are conveyed over link set 43 according to DDR, clock signals are also sent on link 44 according to DDR. Link 56 is responsible for conveying similar signals for the signals conveyed over link set 55.

Link 45 and link 46 are responsible for conveying signals that indicate the beginning and end of messages conveyed by link set 41. To accomplish this, link 45 conveys a signal indicating the beginning of a message being sent over link set 41, and link 46 conveys a signal indicating the end of a message being sent over link set 41. The signals sent over link 45 and link 46 are single data rate (SDR) signals. Thus, the signals are transmitted once during a clock period. In particular embodiments, when a signal is asserted on link 45, the signals on link set 41 contain information regarding the type of message being conveyed, destination addresses, data enable bits, and/or information. Furthermore, when the signal is asserted on link 46, the information on link set 41 contains the last portion of a message. Link 57 and link 58 convey similar signals for messages being conveyed over link set 53.

Link 47 conveys signals that indicate an error has occurred between host computer module 20 and remote computer module 30. Remote computer module 30 uses the signal conveyed over link 47 to indicate whether an error was detected in a message transferring on link set 41. Link 59 conveys a similar signal from remote computer module 30 to host computer module 20 for signals on link set 53.

Link 48 is responsible for conveying a signal indicating that the message being conveyed over link set 41 is a transaction request. Typically, a transaction request is the initiating message for a bus transaction, which will be discussed in more detail below. Host computer module 20 uses the signal on link 48 to indicate that link set 41, link 45, link 46, and link 47 are conveying valid information for a transaction request. In particular embodiments, a complete transaction request should be conveyed over signal transport device 40 before another transaction request will be conveyed; however, individual portions of a transaction request may be interleaved among portions of a transaction response, to be discussed in more detail below. Thus, host computer module 20 may use link 48 to indicate that a portion of a transaction request is being conveyed. Link 60 is responsible for conveying a similar signal from remote computer module 30 to host computer module 20.

Link 49 is responsible for conveying a signal indicating that a transaction response message is being sent from host computer module 20 to remote computer module 30. Typically, a transaction response message is the concluding message for a bus transaction, which will be discussed in more detail below. Host computer module 20 uses link 49 to indicate that link set 41, link 45, link 46, and link 47 contain valid information for a transaction response message. In particular embodiments, a response message should transfer over these links before another transaction response will be conveyed; however, portions of a transaction response message may be interleaved among portions of a transaction request message. Thus, host computer module 20 may use link 49 to indicate that a portion of a transaction response is being conveyed. Link 61 is responsible for conveying a similar signal from host computer module 30 to host computer module 20.

Link 50 is responsible for conveying a signal regarding transaction request credits from remote computer module 30 to host computer module 20. In general, a credit is an indication that a first computer module provides to a second computer module to indicate that the first computer module has room for at least a portion of a certain type of message. In the illustrated embodiment, remote computer module 30 uses the request credit signal to inform host computer module 20 that remote computer module 30 has room in transaction request buffer 34 for at least a portion of a certain type of transaction request message from host computer module 20. Credit generator 38 of remote computer module 30 is responsible for initiating this signal, and host computer module 20 maintains a count of the transaction request credits received with credit counter 28. If the request credit count is zero and remote computer module 30 de-asserts the signal on link 50, host computer module 20 does not transmit another transaction request, or a portion thereof, until remote computer module 30 asserts the signal on link 50 again. In particular embodiments, the signal indicates that a complete transaction request message may be conveyed.

Link 62 conveys a similar signal, which is initiated by credit generator 26, from host computer module 20 to remote computer module 30. Remote computer module 30 maintains a count of the transaction request credits received from host computer module 20 using credit counter 36. If the transaction request credit count is zero and host computer module 20 de-asserts the signal on link 62, remote computer module 30 does not send another transaction request message, or a portion thereof, until host computer module 20 asserts the transaction request credit signal again. In particular embodiments, the signal indicates that host computer module 20 has room for 128-bits of a transaction request message in transaction request buffer 24.

Link 52 is responsible for conveying a control clock signal from host computer module 20 to remote computer module 30. Remote computer module 30 uses the control clock signal to maintain skew across the corresponding control signals, such as, for example, 45, 46, 47, 48, 49, 62, and 63. Link 64 conveys a similar signal from remote computer module 30 to host computer module 20. Host computer module 20 uses the control clock signal to maintain skew across the corresponding control signals, such as, for example, 57, 58, 59, 60, 61, and 50.

Link 63 is responsible for conveying a signal regarding transaction response credits from host computer module 20 to host computer module 30. Host computer module 20 uses the response credit signal to inform remote computer module 30 that host computer module 20 has room in transaction response buffer 25 for at least a portion of a certain type of transaction response message from remote computer module 30. Credit generator 26 of host computer module 20 is responsible for initiating this signal, and remote computer module 30 maintains a count of the transaction response credits received with credit counter 36. If the response credit count is zero and host computer module 20 de-asserts the signal on link 63, remote computer module 30 does not transmit another transaction response message, or a portion thereof, until host computer module 20 asserts the signal on link 63 again. In particular embodiments, the signal indicates that host computer module 20 has room for 128-bits of a transaction request message in transaction response buffer 25.

Link 65 is responsible for conveying a reset signal from host computer module 20 to remote computer module 30. When host computer module 20 asserts the reset signal, remote computer module 30 enters a reset state and reinitializes its internal logic.

As alluded to previously, the protocol for information conveyance on signal transport device 40 is based on message passing. Accordingly, host computer module 20 and remote computer module 30 may use messages to convey information between each other, which is one type of bus transaction. Bus transactions may include reads of information, writes of information, atomic memory operations (AMOs), invalidate-cache flushes, and/or any other appropriate type of operation involving computer modules. In particular embodiments, messages may be used to perform six types of bus transactions—reads of data, writes of data, fetch atomic memory operations (AMOs), stores AMOs, graphics writes, and invalidate cache-flushes. Table 1 lists the six types of bus transactions and the types of messages for each transaction for certain embodiments.

TABLE 1

| Bus Transaction | Requests | Responses |
| --- | --- | --- |
| Reads | Read Request Message | Read Response Message |
| Writes | Write Request Message | Write Response Message |
| Fetch AMOs | Fetch AMO Request Message | Fetch AMO Response Message |
| Store AMOs | Store AMO Request Message | Store AMO Response Message |
| Graphics Writes | Graphics Write Request Message | Graphics Write Credit or Graphics Write Error Response Message |
| Invalidate-Cache Flushes | Invalidate-Cache Flush Request Message | Not Applicable |

Figure 2:
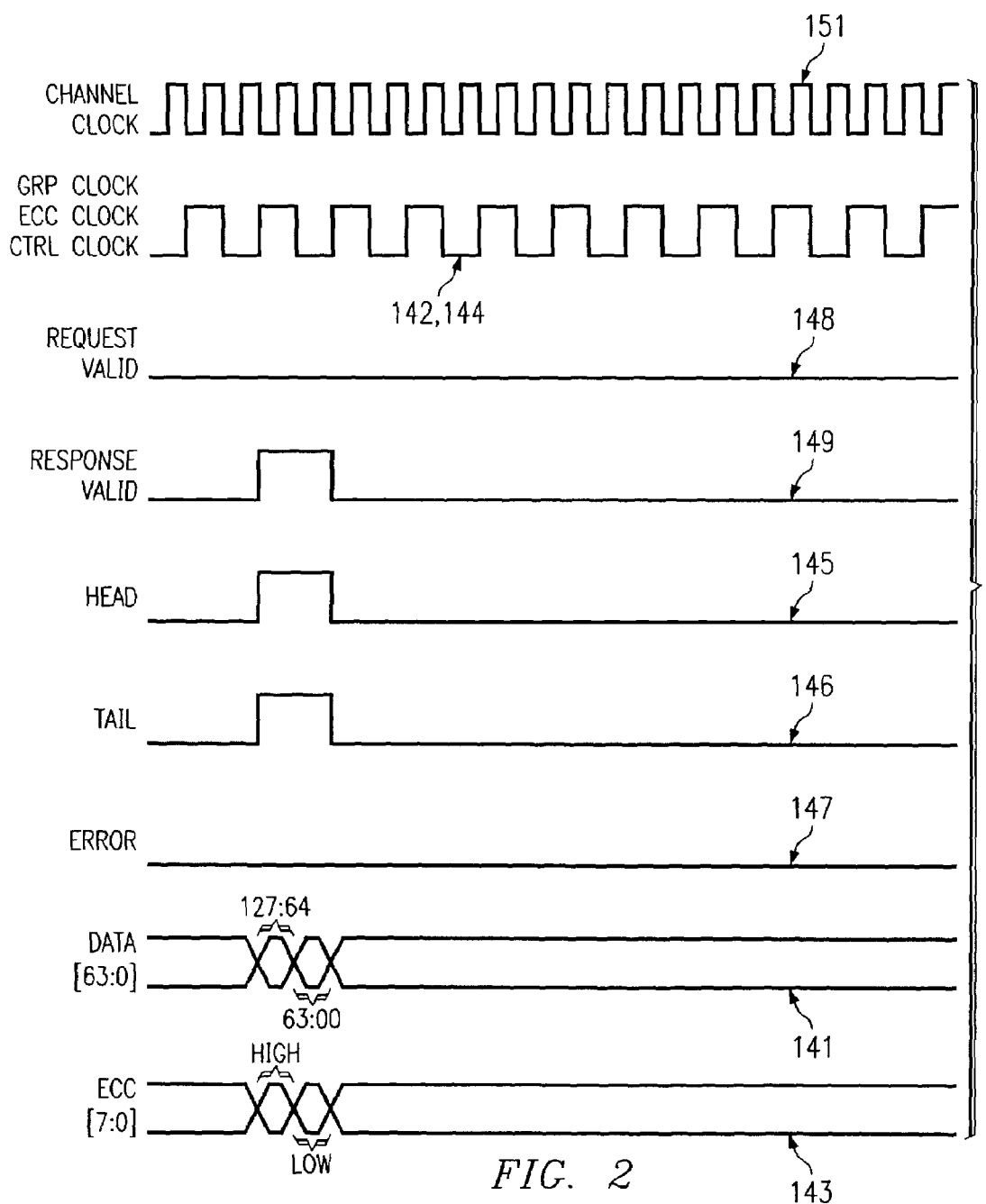
FIG. 2 illustrates a signaling diagram for conveying data in the system of FIG. 1.

In general, a message can be of any size. In particular embodiments, however, messages are sent in 128-bit increments—the amount of information that may be transferred across a link set of signal transport device 40 in one period using DDR, each link conveying a two-bit part of the portion. Furthermore, in certain embodiments, four message sizes are used. In these embodiments, message sizes are based upon a flow control unit (FLIT), each FLIT corresponding to a 128-bit transfer. The messages may be one FLIT, two FLITs, nine FLITs, or ten FLITs in size. The message size used may vary depending on different types of bus transactions and for requests/responses, A timing diagram for sending a one-FLIT message in these embodiments is illustrated by FIG. 2. As illustrated therein, channel clock signal 151 is the signal conveyed on link 51, request valid signal 148 is the signal conveyed on link 48, response valid signal 149 is the signal conveyed on link 49, head signal 145 is the signal conveyed on link 45, tail signal 146 is the signal conveyed on link 46, error signal 147 is the signal conveyed on link 47, information signals 141 are the signals conveyed on link set 41, information group clock signals 142 are the signals conveyed on link set 42, ECC signals 143 are the signals conveyed on link set 43, and ECC clock signal 144 is the signal conveyed on link 44. Accordingly, a message is being sent from host computer module 20 to remote computer module 30. Furthermore, the message is a transaction response message because response valid signal 149 is asserted. Note that response valid signal 149 is only asserted for one period because the message is one-FLIT in length, meaning that it will be conveyed in one period. Moreover, because only a one-FLIT message is being sent, head signal 145 and tail signal 146 are asserted, because the 128-bits of information represented by information signals 141 are the beginning and end of the message.

Figure 3:
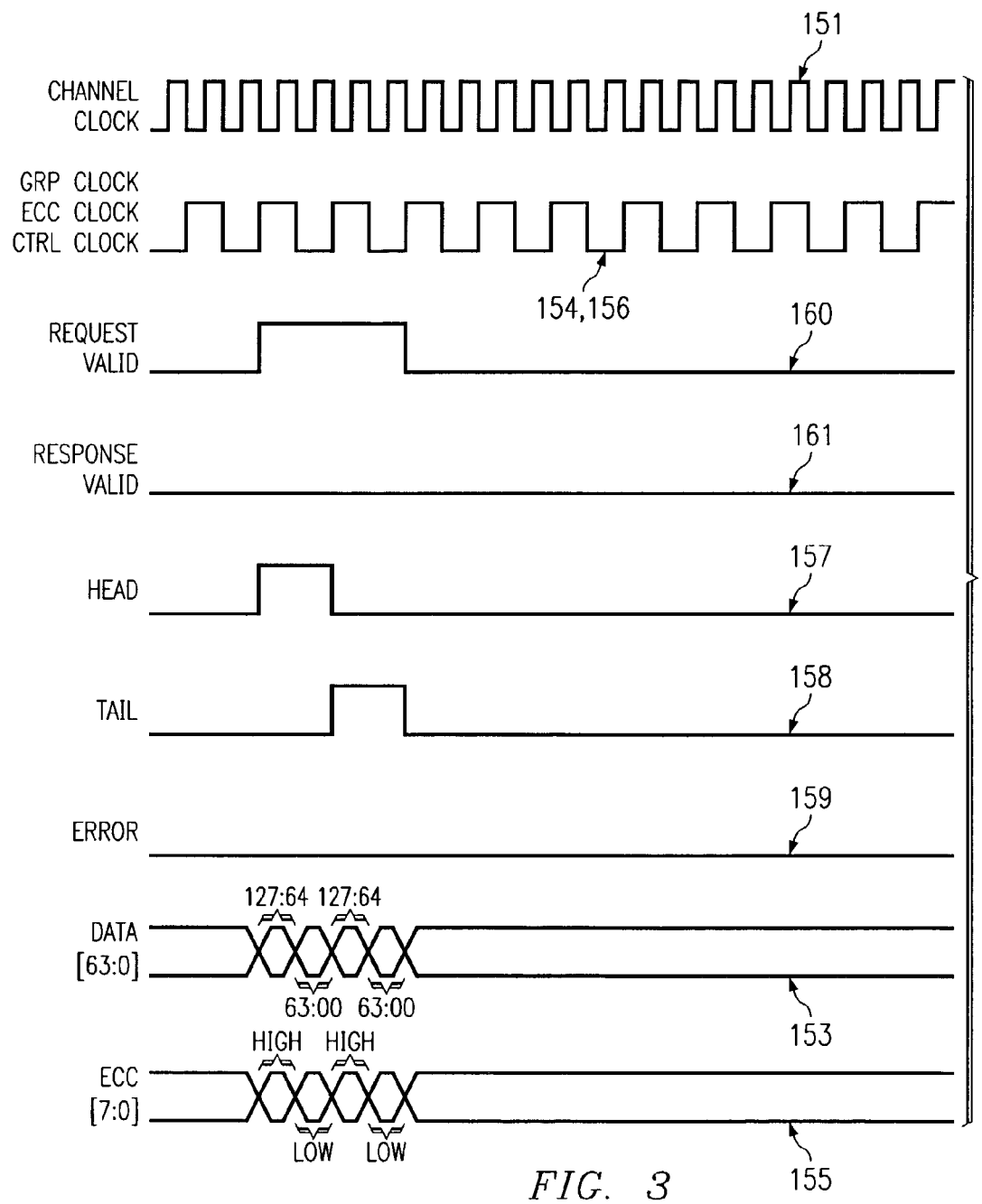
FIG. 3 illustrates another signaling diagram for conveying data in the system of FIG. 1.

FIG. 3 illustrates a two-FLIT message that is being sent from remote computer module 30 to host computer module 20. Thus, channel clock signal 151 is the signal conveyed on link 51, request valid signal 160 is the signal conveyed on link 60, response valid signal 161 is the signal conveyed on link 161, head signal 157 is the signal conveyed on link 57, tail signal 158 is the signal conveyed on link 58, error signal 159 is the signal conveyed on link 159, information signals 153 are the signals conveyed on link set 53, information group clock signals 154 are the signals conveyed on link set 54, ECC signals are the signals conveyed on link set 155, and ECC clock signal 156 is the signal conveyed on link 56. Request valid signal 160 is asserted to indicate that the message is a transaction request. Note that signal 160 is asserted for two periods because a two-FLIT message transfers between the computer modules in two periods. Furthermore, head signal 157 is asserted during the first period of the transfer to indicate that the information conveyed on link set 53 during this period is the first portion of the message, and tail signal 158 is asserted during the second period of the transfer to indicate that the information conveyed on link set 53 during this period is the last portion of the message.

Similar signal timings are used for the nine-FLIT messages and the ten-FLIT messages. For example, for a nine-FLIT message, the request valid or response valid signal would be asserted for nine periods to indicate that the message is a request or a response, respectively, the head signal would be asserted during the first period to indicate that information conveyed on the information link set is the first portion of the message, and the tail signal would be asserted during the ninth period to indicate that the information conveyed on the information link set is the last portion of the message. Additionally, information would be transferred on the appropriate information link set for nine periods. Furthermore, information group clock signals would be conveyed on the appropriate information group clock link set for nine clock periods, ECC signals would be conveyed on the appropriate link set for nine periods, and the ECC clock signal would be sent on the appropriate link for nine periods.

As just discussed, messages can be conveyed in portions over signal transport device 40. In particular embodiments, each portion, or FLIT, corresponds to the amount of information that can be conveyed in one period. For the illustrated embodiment of signal transport device 40, therefore, each FLIT could contain 128-bits, the amount of information that can be sent over one of link set 41 or link set 53 at a DDR.

Each FLIT may be classified as a message head, message body, or message tail. Every message has a message head. Additionally, every message has a message tail, although in some cases, the message tail is the same as the message head. When the head signal is asserted on signal transport device 40 and the request valid or response valid signal is asserted, it indicates that the FLIT being conveyed on one of link set 41 or link set 53 is the first FLIT, or head, of a message. When the tail signal is asserted on the signal transport device and the request valid or response valid signal is asserted, it indicates that the FLIT being conveyed on one of link set 41 or link set 53 is the last FLIT, or tail, of the message. When, however, both the head signal and the tail signal are not asserted on the signal transport device and the request valid signal or the response valid signal is asserted, it indicates that the FLIT being conveyed on one of link set 41 or link set 43 is a middle FLIT, or message body, of a message. Thus, only messages longer than two FLITs have message bodies.

As mentioned previously, in particular embodiments, for each direction of signal transport device 40, a new transaction request message cannot be sent over the signal transport device until all of the FLITs for the previous transaction request have transferred over the signal transport device. Likewise, a transaction response cannot be sent over the signal transport device until all the FLITs of the previous transaction response have transferred over the signal transport device. However, individual FLITs of a transaction request and a transaction response can be interleaved on the signal transport device. For example, if a transaction request was being sent over signal transport device 40, the transaction request valid signal would be asserted while the transaction request message was being sent over the signal transport device. Then, however, before the entire transaction request message was conveyed over the signal transport device, the transaction response valid signal would be asserted, indicating that a transaction response message was being sent over the signal transport device. When one or more FLITs of the transaction response message had been sent, the request valid signal would then again be asserted to signify that the transaction request message was again being conveyed over the signal transport device. Additionally, the head signal would be asserted when the transaction request message originally began to be sent over the signal transport device and again when the transaction response message started to be sent over the signal transport device. Furthermore, the tail signal would be asserted when the transaction response message was finished being conveyed over the signal transport device, and the tail signal would be asserted when the transaction request message had completed its conveyance over the signal transport device.

As mentioned previously, signal transport device 40 conveys messages between host computer module 20 and remote computer module 30. The messages may contain status data about a computer module, data from a computer module, commands for a computer module to perform an action, such as send particular data back to the requesting computer module, and/or any other appropriate type of information. In general, messaging is accomplished with transaction request messages, which may contain status data, data, and/or commands, and transaction response messages, which may contain status data and/or data. The messages may have any appropriate form for conveying information between computer modules.

FIG. 4 illustrates a first FLIT 200 of a message for particular embodiments of the invention. Note that FLIT 200 may itself be the message or may be the initial portion of a message. First FLIT 200 contains a command word section 210 and a message head section 230. As illustrated, command word section 210 occupies 32-bits of the FLIT, and message head 230 occupies 96-bits of the FLIT. In other embodiments, however, command word section 210 and message head section 230 may occupy any number of bits in the FLIT.

In more detail, command word section 210 contains fields that supply identification, error, and control information for the message. In the illustrated embodiment, these fields are the destination identification (ID) field 212, the sound ID field 214, the message type field 216, the transaction number field 218, the data size field 220, the processor input/output (PIO) transaction field 222, the error field 224, and the read type field 226. Furthermore, the destination ID field occupies 2-bits, the source ID field 224 occupies 2-bits, the message type field occupies 4-bits, the transaction number field occupies 8-bits, the data size field occupies 2-bits, the PIO transaction field 222 occupies 1-bit, the error field 224 occupies 1-bit, and the read type field 226 occupies 2-bits of command word section 210. But in other embodiments, the fields may have varying sizes and/or arrangements in command word section 210. Note that not all of the space in command word section 210 is used; this space may be reserved to allow for compatibility between different versions of system 10 and may contain zeros when not used.

Message type field 216 indicates the type of bus transaction with which the message is associated and whether the message is a request or a response for that transaction. Bus transactions may include reads of data, writes of data, atomic memory operations, invalidate-cache flushes, and/or any other appropriate type of operation involving computer modules. Table 2 illustrates the values that message type field 216 may contain certain embodiments, along with the associated message types.

TABLE 2

| Bus Transaction | Message Type [3:0] | Message Type |
|---|---|---|
| Reads | 0000 | Read Request |
|  | 0001 | Read Response |
| Writes | 0010 | Write Request |
|  | 0011 | Write Response |
| Not Applicable | 0100 | Reserved |
|  | 0101 | Reserved |

Transaction number field 218 associates a transaction response message with its corresponding transaction request message. The computer module that creates the transaction request message places the transaction number in transaction number field 218 of the transaction request package. When, and possibly if, the computer module that receives the transaction request message creates a transaction response message, the computer module places the transaction number that was in the request message into transaction number field 218 of the response message. In the illustrated embodiment, transaction number field 218 is actually split between fields of command word section 210, the lower order bits of the transaction number residing in transaction number field 218a and the higher order bits of the transaction number residing in the bits of field 218b. For particular embodiments, messages used for read, write, fetch AMO, and store AMO bus transactions require a transaction number. Messages used for graphics write and invalidate-cache flush bus transactions, however, have the transaction numbers set to zero. Table 3 illustrates the bus transactions that require transaction numbers for these embodiments.

TABLE 3

| Bus Transaction | Message Type [3:0] | Message Type | TNUM Value |
|---|---|---|---|
| Reads | 0000 | Read Request | Transaction Number |
|  | 0001 | Read Response | Transaction Number |
| Writes | 0010 | Write Request | Transaction Number |
|  | 0011 | Write Response | Transaction Number |
| Not Applicable | 0100 | Reserved | Not applicable |
|  | 0101 | Reserved | Not applicable |

The logic used to maintain transaction numbers in a computer module is implementation specific. For example, a designer may choose to provide up to 255 outstanding requests, regardless of the type of bus transactions that are occurring, or a designer may choose to provide up to 255 outstanding requests for each type of bus transaction supported by the computer modules.

PIO transaction field 222 indicates whether the bus transaction is associated with the memory of a processor, such as, for example, a register. For example, in particular embodiments, PIO transaction field 222 is one bit in size, with a one indicating that the bus transaction is associated with processor memory. Thus, if remote computer module 30 issues a read transaction request with the PIO transaction bit equal to zero, it indicates that remote computer module 30 is requesting a read of data stored in non-PIO memory, such as, for example, system memory. When, however, the PIO transaction bit is one, it indicates that the bus transaction is associated with PIO space. For instance, when host computer module 20 issues a write request with the PIO transaction bit set to one, it indicates that host computer module 20 is requesting a write of data into a register of remote computer module 30. Accordingly, in particular embodiments, the PIO transaction bit would be set to zero for all non-PIO memory related transactions, including reads, writes, fetch AMOs, store AMOs, and invalidate-cache flush, but the PIO transaction bit would be set to one for all PIO related transactions, including reads and writes. Furthermore, the PIO transaction bit could be set to one for graphics operations.

Read type field 226 is valid for memory read transaction requests and memory read transaction responses. For other transactions, read type field 226 could be set to zero. In particular embodiments, read type field 226 contains two bits, and when message type field 216 is set to 0000, indicating a read request message, and the PIO transaction bit is set to zero, indicating a non-processor memory transaction, read type field 226 indicates the type of memory read requested. Table 4 illustrates the type of memory reads for these embodiments. When, however, message type field 216 is set to 0001, indicating a read response message, and the PIO transaction bit is set to zero, indicating a non-processor memory transaction, the read type field indicates the type of memory read response. Table 5 illustrates the memory read responses for the detailed embodiment.

Table 4

| Read Type [1:0] | Read Request Type | Description |
| --- | --- | --- |
| 00 | Get | Read data from a memory location. The data is coherent at the time of the read. The HCM will not notify the RCM when the data is modified in system memory. |
| 01 | Reserved | Reserved |
| 10 | Cached, not timed | Read data from memory location. The data is coherent at the time of the read. When the data is modified in system memory, the HCM performs an Invalidate-Cache Flush bus transaction to notify the RCM that the data is no longer valid. |
| 11 | Cached, timed | Read data from a memory location. The data is coherent at the time of the read. When the data is modified in system memory before a predetermined time-out value has expired, the HCM performs an Invalidate-Cache Flush bus transaction to notify the RCM that the data in the RCM is no longer valid. When the data is modified in system memory after a predetermined time-out value has expired, the HCM will not notify the RCM when the data is modified in system memory and the RCM automatically invalidates the corresponding data stored in the RCM. |

TABLE 5

| Read Type [1:0] | Read Response Type | Description |
| --- | --- | --- |
| 00 | Non-speculative | The read data in this read response message is valid and may be used by the RCM. |
| 01 | Reserved | Reserved |
| 10 | Speculative | The read data in this read response message is speculative and should not be used by the RCM until it receives either a speculative-acknowledge read-response message or a non-speculative read response message. The speculative-acknowledge read-response message indicates that the data revived in a previous speculative-read-response message is valid and may be used by the RCM. The non-speculative read response message indicates that the data received in a previous speculative-read-response message is not valid and should be replaced by the data provided in the non-speculative read response message. |

TABLE 5-continued

| Read Type [1:0] | Read Response Type | Description |
| --- | --- | --- |
| 11 | Speculative Acknowledge | The read data received in a previous speculative-read-response message is valid and may be used by the RCM. |

Data size field 220 indicates the total number of bytes of data, such as, for example, memory data, graphics data, or register data, associated with a bus transaction. In particular embodiments, data size field 220 is 2-bits in size and may be used to provide the indications denoted in Table 6.

TABLE 6

| Data Size [1:0] | Bytes of Data in Transaction | Corresponding Request or Response Message Sizes |
| --- | --- | --- |
| 00 | 8-bytes | One-FLIT message or Two-FLIT message |
| 01 | Reserved | Not applicable |
| 10 | 128-bytes | Nine-FLIT message |
| 11 | 128-bytes | Nine-FLIT message or Ten-FLIT message |

Note that messages may also contain byte enable fields, which indicate which bytes in the 8-bytes or 128-bytes of data are valid. In general, the byte enable fields are not part of the command words, although they could be, and will be discussed in more detail later.

For read transactions, data size field 220 in a transaction request message indicates the amount of data to place in the transaction response message. There is, of course, typically no data in a read request message. For write transactions, however, data size field 220 in a transaction request message indicates the amount of data, such as, for example, memory, graphics, or register, present in the transaction request message. The transaction response message may have the same value in data size field 220, but there is typically no data in the transaction response message.

Source ID field 214 contains an identifier for the source of a message. In particular embodiments, the identifier is an identifier remote computer module 30 and matches the identification number of signal transport device 40. Furthermore, the identifier is a two-bit value stored in a programmable register in remote computer module 30. For transaction request and transaction response messages from remote computer module 30 to host computer module 20, remote computer module 30 places the identifier in source ID field 214 of the message. For transaction request and transaction response messages from host computer module 20 to remote computer module 30, source ID field 214 has no meaning, and host computer module 20 sets source ID field 214 to zero.

Destination ID field 212 contains an identifier the destination of a message. In particular embodiments, the identifier is an identifier for signal transport device 40 and is a two-bit value. For transaction request messages from host computer module 20 to remote computer module 30, host computer module 20 places the identifier in destination ID field 212 of the message. For transaction response messages from host computer module 20 to remote computer module 30, host computer module 20 places the source ID from the transaction request message that it received from remote computer module 30 into destination ID field 212 of the response message that it sends back to remote computer module 30. For transaction request and transaction response messages from remote computer module 30 to host computer module 20, destination ID field 212 has no meaning and is set to zero.

Error field 222 indicates whether an error occurred during the processing of a bus transaction. In particular embodiments, error field 222 is one-bit in size and indicates whether or not an error occurred during the processing of a transaction request message. Thus error field 224 may only be valid for transaction response messages and may be zero for transaction request messages. Examples of errors that would cause the error field 224 to indicate an error are: 1) a request to access a memory address that does not exist; 2) a request to write data into a read only register; and 3) a request to write more data into a register than the register can hold.

In general, messages contain different types and/or amounts of data depending on the size and/or purpose of the message. Thus, for message 200, there may be any number of formats for message head section 230. In certain embodiments, however, message head section 230 message may contain a byte enable information, a graphics credit, data, and/or an address. Of course, section 230 may also contain nothing.

FIG. 5 illustrates a one-FLIT message containing byte enable information, a graphics credit, and data. As discussed previously, the message contains command word section 210, which may be configured as discussed previously. The message also contains a byte enable field 232, a graphics credit field 234, and data fields 236, which may contain memory, graphics, or register data, for example. For the illustrated embodiments, this type of message may be used for: 1) PIO 8-byte Read Response messages; 2) PIO Error Read Response messages; 3) Memory Read Error Response messages; and 4) Fetch AMO Response messages. Note, however, that not all of the fields may be used for each of the message types. For example, PIO error Read Response messages and the Memory Read Error response message may not include data fields 236. The graphics credit is used to manage graphics request flow from a higher level than the Request Credit 50 credits. Graphics credits are maintained at the source of the graphics request messages, for example a processor, so requests can flow without interruption from the source to the RCM. In other words, the source knows how much room is available at the destination which allows graphics requests to not be slowed by the flow-control of any intermediate interconnects.

Illustrated in FIG. 6, is a one-FLIT message containing an address. As with other messages, this message contains command word section 210 and a message head section 230. Message head section 230 includes byte enable field 232, graphics credit field 234, and an address field 238. In the illustrated embodiment, address field 238 is 56-bits in length, although it may be of any other size in other embodiments. For this embodiment, this type of format may be used for: 1) PIO 8-byte Read Request messages; 2) PIO Full 128-byte Read Request messages; 3) Memory 128-byte Read Request message; 4) Fetch AMO Request messages; and 5) Invalidate Cache Flush Request messages, although some fields may not be used in each of the message formats.

Another type of one-FLIT message that may be used contains byte enable field 232 and graphics credit field 234 in message head section 230. In the illustrated embodiments, this type of one-FLIT message may be used for: 1) PIO 8-byte Write Response messages; 2) PIO Partial 128-byte Write Response messages; 3) Memory 128-byte Write Response messages; 4) Store AMO Response messages; 5) Graphics Write Credit Response messages; 6) Graphics Write Error Response messages; and 7) Memory 128-byte Speculative-Acknowledge Response messages, although some fields may not be used in each of the message formats.

A two-FLIT message, in contrast, contains a message head—the first FLIT—and a message tail—the second FLIT. In particular embodiments, this message format may be used for transaction request messages that contain up to 8-bytes of data that will be written to system memory, a graphics device, or a register. As such, the first FLIT of the message may be similar to the one FLIT message illustrated in FIG. 6, and the second FLIT of the message may contain the data, typically in bits [63:0]. This type of message format may be used for: 1) PIO 8-byte Write Request messages; 2) Store AMO Request messages; and 3) Graphics 8-byte Write Request messages, although some fields are not used in some of the message formats.

A nine-FLIT message contains a message head, seven body segments, and a tail. This message format is commonly used for request and response messages that contain larger amounts of data. In particular embodiments, the message is used to convey up to 128-bytes of data. In general, the first FLIT of this type of message may be similar to the FLIT illustrated by FIG. 6. The remaining FLITs of this message may contain data, from or for a memory, graphics, or a register. This type of message format may be used for: 1) Graphics 128-byte Write Request messages, which may contain 16, 32, 64 or 128 bytes of valid data; 2) PIO Full 128-byte Read Response messages; 3) Memory Full 128-byte Write Request messages; 4) Memory Full 128-byte Read Response messages; and 5) Memory Full 128-byte Speculative-Read Response messages, although some fields may not be used in each of the messages.

A ten-FLIT message contains a message head, eight body segments, and a message tail. This message format is commonly used for write request messages that contain larger amounts of data. In particular embodiments, the message up to convey up to 128 bytes of data. In general, the first FLIT of the ten-FLIT message may be similar to the FLIT illustrated by FIG. 6, except for the fact that it may not have byte enable field 232. The second FLIT of the message may contain 128-bits of cache-line byte enables, to be discussed in more detail below, and the remaining eight FLITs of the message may contain up to 128-bytes of data. This type of message format may be used Some bus transactions that may be implemented using this type of message format include: 1) PIO Partial 128-byte Write Request messages, which may contain 1 to 128-bytes of valid data; and 2) Memory Partial 128-byte Write Request messages, which may contain 1 to 128 bytes of valid data, although some fields are not used in each of the messages.

Byte enable field 232 facilitates using Big Endian mode or Little Endian mode, which are two common types of addressing modes with which computer systems reference data in memory. To accomplish this, byte enable field 232 allows messages to indicate which bytes of the data portion of the message contain valid data. For particular embodiments, byte enable field 232 specifies which bytes of an 8-byte or a 128-byte data segment, which may be part of a PIO transaction or a memory transaction, are valid. For one-FLIT or two-FLIT messages, the data may reside in an 8-byte field that resides in bits [63:0] of a FLIT. Because of the fixed data field size, the address used for these transactions should be aligned on 8-byte boundaries in memory, i.e., address bits [2:0] should be equal to zero. Thus, an 8-bit byte enable field may indicate the validity of each of the 8-bytes of data, one bit being associated with each of the 8-bytes. Thus, the byte enable field provides a means for signal transport device 40 to support both Big Endian and Little Endian addressing modes. For example, when byte address 0x1 contains valid data in Big Endian mode, the seventh byte enable bit is set. When, however, byte address 0x1 contains valid data in Little Endian mode, the second bit of byte enable field 232 is set.

As mentioned previously, the byte enable field in a ten-FLIT message may occupy the entire second FLIT. This allows the specification of the validity of each byte in the remaining eight FLITS. For example, in the embodiments where each FLIT contains 128-bits, the data up to 128-bytes that reside in the last eight FLITs of the message. Because of the data field size, the address used for these transactions are aligned on 128-byte boundaries in memory, i.e., address bits [6:0] should be equal to zero. The byte enable field in ten-FLIT messages would then be a 128-bit field in the second FLIT of the message, with one bit corresponding to each of the 128-bytes of data. Thus, the ten-FLIT byte enable field provides a means for signal transport device 40 to support both Big Endian and Little Endian addressing modes. For example, when byte address 0x1 contains valid data in Big Endian mode, byte enable bit 126 is one, but when byte address 0x1 contains valid data in Little Endian mode, byte enable bit 113 is one. Note that while the ordering of bytes within a 128-bit data field FLIT is different depending on the addressing mode, the first data field FLIT transferred always contains quad word zero, and the last data field FLIT transferred always contains quad word seven, regardless of the addressing mode.

In particular embodiments, when data is part of a Fetch AMO transaction or a Store AMO Transaction message, which will be discussed in more detail below, the data field in the message is an 8-byte field. However, AMO transactions may perform operations on an 8-byte or a 4-byte operand value in memory, and although the data field may be a fixed 8-byte size in a message, the address for AMO transactions may be aligned on 64-byte boundaries in memory, i.e., address bits [5:0]—are not used for the address. In each 64-byte AMO space in memory, therefore, only 64-bit, bits [63:0], for example, contain the current operand value, and 64-bits, bits [127:64], for example, contain the previous operand value. Thus, while the 8-byte data field in an AMO transaction message may correspond to the current AMO operand in memory, this 64-bit location may be used as one 64-bit operand or as two 32-bit operands. The byte enable field in an AMO transaction message, therefore, may enable an entire 64-bit double word in memory, or enable the upper-half or lower-half of the 64 bit double word in memory as illustrated by Table 7. Byte enable values other than 0x0F, 0xF0, or 0xFF are not supported and may result in an error.

TABLE 7

| Byte Enable Bits [90:88] | Valid Data in Message |
| --- | --- |
| 000 | Reserved—Not a valid Byte Enable value. |
| 001 | The least-significant 16 bytes of data are valid. |
| 010 | The least-significant 32 bytes of data are valid. |
| 011 | The least-significant 64 bytes of data are valid. |
| 100 | All 128 bytes of data are valid. |
| 101 | Reserved—Not a valid Byte Enable value. |
| 110 | Reserved—Not a valid Byte Enable value. |
| 111 | Reserved—Not a valid Byte Enable value. |

The amount of data in a graphics transaction message may be similar to the amount of data in a memory transaction or a PIO transaction. Accordingly, in particular embodiments, the data field in a graphics transaction message may be an 8-bytes or 128-bytes. When the data is 8-bytes, the message is typically a two-FLIT message, and the byte enable field in a two-FLIT graphics message performs the same function as the byte enable field of a two-FLIT PIO transaction message or a memory transaction message, each bit of the 8-bit byte enable field indicating that a corresponding byte of data is valid. When, however, the data of a graphics transaction message is 128-bytes, the message is typically a nine-FLIT message, and the byte enable field of a nine-FLIT message is not 128-bits that enables each of the 128-bytes, but 8-bits that indicate the number of valid bytes of the 128-bytes of graphic data. For example, the byte enable field may indicate that the least significant 16-bytes, 32-bytes, 64-bytes, or 128-bytes are valid.

Table 8 provides a summary of the transaction request messages and transaction request responses used on signal transport device 40 for particular embodiments. In other embodiments, fewer, more, and/or a different combination of message types may be used.

TABLE 8

| Request Messages | | | | | Response Messages | | | | | | |
| --- | --- | --- | --- | --- | --- | --- | --- | --- | --- | --- | --- |
| Name | Msg Typ | PIO | Read Typ | Data Size | Size | Name | Msg Typ | PIO | Read Typ | Data Size | Size | TNUM |
| Memory Full 128-byte Read (Get) | 0x0 | 0 | 00 | 10 | One FLIT | Memory Full 128-byte Read (Non-speculative) | 0x1 | 0 | 00 | 10 | Nine FLIT | Y |
| | | | | | | Memory Full 128-byte Read (Speculative) | 0x1 | 0 | 10 | 10 | Nine FLIT | Y |
| | | | | | | Memory Full 128-byte Read (Speculative Acknowledge) | 0x1 | 0 | 11 | 10 | Nine FLIT | Y |
| Memory Full 128-byte Read (Cache not timed) | 0x0 | 0 | 10 | 10 | One FLIT | Memory Full 128-byte Read (Non-speculative) | 0x1 | 0 | 00 | 10 | Nine FLIT | Y |
| | | | | | | Memory Full 128-byte Read (Speculative) | 0x1 | 0 | 10 | 10 | Nine FLIT | Y |
| | | | | | | Memory Full 128-byte Read (Speculative Acknowledge) | 0x1 | 0 | 11 | 10 | One FLIT | Y |

TABLE 8-continued

| Request Messages | | | | | | Response Messages | | | | | |
|---|---|---|---|---|---|---|---|---|---|---|---|
| Name | Msg Typ | PIO | Read Typ | Data Size | Size | Name | Msg Typ | PIO | Read Typ | Data Size | Size | TNUM |
| Memory Full 128-byte Read (Cache timed) | 0x0 | 0 | 11 | 10 | One FLIT | Memory Full 128-byte Read (Non-speculative) | 0x1 | 0 | 00 | 10 | Nine FLIT | Y |
| | | | | | | Memory Full 128-byte Read (Speculative) | 0x1 | 0 | 10 | 10 | Nine FLIT | Y |
| | | | | | | Memory Full 128-byte Read (Speculative Acknowledge) | 0x1 | 0 | 11 | 10 | Nine FLIT | Y |
| PIO 8-byte Read | 0x0 | 1 | 00 | 00 | One FLIT | PIO 8-byte PIO | 0x1 | 1 | 00 | 00 | One FLIT | Y |
| PIO Full 128-byte Read | 0x0 | 1 | 00 | 10 | One FLIT | PIO Full 128-byte Read | 0x1 | 1 | 00 | 10 | Nine FLIT | Y |
| Memory Full 128-byte Write | 0x2 | 0 | 00 | 10 | Nine FLIT | Memory Full 128-byte Write | 0x3 | 0 | 00 | 10 | One FLIT | Y |
| Partial 128-byte Memory Write | 0x2 | 0 | 00 | 11 | Ten FLIT | Partial 128-byte Memory Write | 0x3 | 0 | 00 | 11 | One FLIT | Y |
| PIO 8-byte Write | 0x2 | 1 | 00 | 00 | Two FLIT | PIO 8-byte Write | 0x3 | 1 | 00 | 00 | One FLIT | Y |
| PIO Partial 128-byte Write | 0x2 | 1 | 00 | 11 | Ten FLIT | PIO Partial 128-byte Write | 0x3 | 1 | 00 | 11 | One FLIT | Y |
| Fetch AMO | 0x6 | 0 | 00 | 00 | One FLIT | Fetch AMO | 0x7 | 0 | 00 | 00 | One FLIT | Y |
| Store AMO | 0x8 | 0 | 00 | 00 | Two FLIT | Store AMO | 0x9 | 0 | 00 | 00 | One FLIT | Y |
| Graphics 8-byte Write | 0xA | 1 | 00 | 00 | Two FLIT | Graphics Credit or Error | 0xB | 1 | 00 | xx | One FLIT | N |
| Graphics Full 128-byte Write | 0xA | 1 | 00 | 10 | Nine FLIT | Graphics Credit or Error | 0xB | 1 | 00 | xx | One FLIT | N |
| Graphics Partial 128-byte Write | 0xA | 1 | 00 | 11 | Nine FLIT | Graphics Credit or Error | 0xB | 1 | 00 | xx | One FLIT | N |
| Invalidate-Cache Flush | 0xD | 0 | 00 | 00 | One FLIT | Not applicable | | | | | | N |

As mentioned previously, a bus transaction typically consists of a request message and one or more response messages. In particular embodiments, there are six types of bus transactions: read, write, fetch AMO, store AMO, graphics write, and invalidate-cache flush. Only certain types of bus transactions, however, are valid depending upon whether the transaction is requested by host computer module 20 for remote computer module 30, requested by remote computer module 30 for host computer module 20, or are requested by remote computer module 30 for another computer module. Table 9 illustrates the transaction types and their validity for transfer for these embodiments.

TABLE 9

| | | Valid Transactions | | |
|---|---|---|---|---|
| Type | Bus Transaction | HCM to RCM | RCM to HCM | RCM to RCM |
| Reads | PIO 8-Byte Read | Yes | Yes | Yes |
| | PIO Full 128-Byte Read | Yes | Yes | Yes |
| | Memory Full 128-Byte Read | No | Yes | No |
| Writes | PIO 8-Byte Write | Yes | Yes | Yes |
| | PIO Partial 128-Byte Write | Yes | Yes | Yes |
| | Memory Partial 128-Byte Write | No | Yes | No |
| | Memory Full 128-Byte Write | No | Yes | No |
| Fetch AMOs | Fetch AMO | No | Yes | No |
| Store AMOs | Store AMO | No | Yes | No |
| Graphics Writes | Graphics 8-Byte Write | Yes | No | Yes |
| | Graphics Full 128-Byte Write | Yes | No | Yes |
| Invalidate-Cache Flush | Invalidate-Cache Flush | Yes | No | No |

Read transactions consist of a request message that contains a read address and a response message that contains the read data. In particular embodiments, there are two types of read transactions—PO reads and memory reads.

Host computer module 20 and remote computer module 30 may use PIO read transactions to read data from processor memory, such as, for example registers, or for peer-to-peer input/output transactions. In particular embodiments, PIO read transactions are valid only if data size field 220 indicates 8-bytes or 128-bytes. Transaction request messages for PIO reads with data size field 220 set to a different value may result in a response message with an error bit equal to zero or a discard of the request message.

For an 8-byte PIO read transaction, the transaction consists of a PIO 8-byte Read Request message and a PIO 8-byte Read Response message with matching transaction numbers. The PIO 8-byte Read Request message is a one-FLIT message. Valid portions of this message are command word section 210 and message head section 230. Command word section 220 includes the fields illustrated in FIG. 4. Destination ID field 212 and source ID field 214 contain identifiers depending on which computer module is producing the read request, as discussed previously. Message type field is 0x0, which indicates the message is a read request, and transaction number field 218 contains a valid transaction number for the read request. Data size field is 0x0, which indicates that the message is a request for an 8-byte double word of register data. Additionally, PIO transaction field 222 is one, which indicates a PIO transaction, and the error field 224 is zero, because errors should not be asserted for request messages.

Message head section 230 includes byte enable field 232 and address field 238. Byte enable field 232 contains a key that allows the register access to occur; however, the byte enable value is not returned in the PIO 8-byte Read Response message, and the requesting computer module should keep track of which bytes will be valid in the response message. Address field 238 contains the 56-bit address of the register to be read. For this type of transaction, the address should be aligned on 8-byte boundaries.

The PIO 8-byte Read Response message is also a one-FLIT message. Valid portions of this message are command word section 210 and message head section 230. Command word section 210 includes the fields illustrated in FIG. 4. Destination ID field 212 and source ID field 214 contain identifiers depending on which computer module is producing the read response, as discussed previously. Message type field 216 is 0x1, indicating a read response. Transaction number field 218 contains the transaction number that was used for the corresponding PIO 8-byte Read Request message. Data size field 220 is 0x0, indicating that the message contains an 8-byte double word of register data, and PIO transaction field 222 is one, indicating that a PIO transaction is occurring. Error field 224 is valid and, if error an has occurred in the bus transaction, is one. Message head section 230 contains the 8-bytes of register data reside in the final 64-bits of the response message. The requesting computer module should keep track of which bytes of this data are valid based on the PIO 8-byte Read Request message that it originally created.

A PIO Full Cache-Line Read transaction is used to read data from registers of a computer module. For example, remote computer module 30 may use this transaction to read data from the registers of another remote computer module. In the detailed embodiment, this transaction includes the PIO Full 128-byte Read Request message and the PIO Full 128-byte Read Response message with matching transaction numbers. Note that remote computer module 30 may use a PIO Full Cache-Line Read transaction to read up to 128-bytes of data from another remote computer module.

The PIO Full 128-byte Read Request message is a one-FLIT message. Valid portions of this message include command word section 210 and message head section 230. Command word section 210 includes the fields illustrated in FIG. 4. Destination ID field 212 and source ID field 214 field contain identifiers depending on which computer module is producing the read request, as discussed previously. Message type field 216 is 0x0, which indicates the message is a read request. Transaction number field 218 contains a valid transaction number for the read request. Data size field 220 is 0x2, which indicates that the message is a request for a full 128-bytes of register data, and PIO transaction field 222 is one, which indicates a PIO transaction. Error field 224 is zero, because the errors should not be asserted for request messages. Message head section 230 includes address field 238, which contains the 56-bit address of the register to be read. For this type of transaction, the address should be aligned on 128-byte boundaries, i.e., bits [6:0] should be zero.

The PIO Full 128-byte Read Response message, in contrast, is a nine-FLIT message. Valid portions of this message include command word section 210 of the first FLIT and the entirety of the remaining eight FLITs, which contain up to 128-bytes of register data. Command word section 210 includes the fields illustrated in FIG. 4. Destination ID field 212 and source ID 214 field contain identifiers depending on which computer module is producing the read response, as discussed previously. Message type field 216 is 0x1, which indicates that the message is a read response, and transaction number field 218 contains the same transaction number that was used for the corresponding PIO Full 128-byte Read Request message. Furthermore, data size field 220 is 0x2, which indicates that the message contains a full 128-bytes of register data, and PIO transaction field 220 is one, which indicates a PIO transaction. Error field 224 is valid and, if equal to one, indicates that an error occurred during the processing of the bus transaction. Note that if an error has occurred, the PIO Full 128-byte Read Response message may be a one-FLIT message with the error field equal to one in command word section 210, and, thus, the requesting computer module may need to be able to process either size error message appropriately. The 128-bytes of register data reside in the body of the PIO Full 128-byte Read Response message, i.e., the last eight FLITS.

Memory read transactions are used to read data from non-processor memory of another computer module. For example, remote computer module 30 may use such a transaction to read data from system memory of host computer module 20. In particular embodiments, memory read transactions are valid only if data size field 220 of command word section 210 is 0x0, indicating 8-bytes, or 0x2, indicating a full 128-bytes. Transaction request messages for memory reads with data size field 220 set to a different value may result in a response message with error field 224 set to one, or the request message being discarded.

Remote computer module 30 may use a Memory Full 128-Byte Read transaction to read 128 bytes of data from non-processor memory. This transaction consists of a Memory Full 128-Byte Read Request message and one of three types of response messages with matching transaction numbers: 1) a Memory Full 128-Byte Read Non-speculative Response message; 2) a Memory Full 128-Byte Read Speculative Response message; or 3) a Memory Full 128-Byte Read Speculative Acknowledge message.

The Memory Full 128-Byte Read Request message is a one-FLIT message. Valid portions of this message include command word section 210 and message head section 230. Command word field 210 includes the field illustrated in FIG. 4. Destination ID field 212 and source ID 214 field contain identifiers depending on which computer module is producing the read request, as discussed previously. Message type field 216 is 0x0, indicating that the message is a read request, and transaction number field 218 contains a valid transaction number for the read request. Data size field 220 is 0x2, indicating that the message is a request for a full 128-bytes of memory data, and PIO transaction field 222 is zero, indicating a non-processor memory transaction. Read type field 226 indicates whether the read request is a Get (0x0), Cached, Not Timed (0x2), or Cached, Timed (0x3) read, which will be discussed in more detail below. Error field 224 is zero, because errors should not be asserted for request messages. Message head section 230 includes address field 238, which indicates the 56-bit address of the memory location to be read. For this type of transaction, the address should be aligned on 128-byte boundaries, i.e., address bits [6:0] should be zero.

As mentioned previously, there are three types of response messages to this read request. The first is the Memory Full 128-Byte Read Non-speculative Response message, which contains 128-bytes of valid read data. Only one such response message should be generated because it completes the read transaction. The second response message is the Memory Full 128-Byte Read Speculative Response message, which contains 128-bytes of unverified read data. Multiple such message may be generated because this type of response message does not complete the read transaction. A subsequent Memory Full 128-Byte Read Non-speculative Response message or a subsequent Memory Full 128-Byte Read Speculative Acknowledge message completes the read transaction. The third response message is the Memory Full 128-Byte Read Speculative Acknowledge message, which contains no read data, but indicates that the read data in a previously received speculative response message is valid. Only one such response message should be generated because it completes the read transaction. The read response messages are one-FLIT messages or nine-FLIT messages.

Valid portions in the 9-FLIT messages include command word section 210 and the entirety of the following 8 FLITS, which contain the 128-bytes of memory data.

Command word section 210 includes the section illustrated in FIG. 4. Destination ID field 212 and source ID 214 field contain identifiers depending on which computer module is producing the read response, as discussed previously. Message type field is 0x1, which indicates that the message is a read response, and transaction number field 218 contains the same transaction number that was used for the corresponding read request message. Data size field 220 is 0x2, which indicates that the message contains 128-bytes data, valid or unverified. PIO transaction field is zero, which indicates a non-processor memory transaction. Read type field 226 indicates the type of read response message—non-speculative (0x0) or speculative (0x2). Error field 224 is valid and, if equal to one, indicates that an error occurred during the processing of the bus transaction. The remaining eight-FLITS of the message include the 128-bytes of valid or unverified data. Note that if an error occurs, the read response message may be either a one-FLIT message or a nine-FLIT message that has error field 224 set to one in command word section 210. The requesting computer module may need to be able to process either size of error message correctly. The one-FLIT message is similar to the nine-FLIT message except for the fact that it does not contain the eight-FLITS of data and read type field 226 is 0x3, indicating a speculative acknowledgement. The data size for the speculative acknowledge is 0x2 and is associated with 128-bytes of data.

A write transaction allows one computer module to send data to a particular location in another computer module. A write transaction typically consists of the data that is being sent from the initiating computer module and the address to which the data is to be written. A response message typically confirms that the write occurred or failed. In particular embodiments, there are two types of write transactions, PIO writes and memory writes.

Host computer module 20 and remote computer module 30 may use PIO write transactions to write data into processor memory or to perform peer-to-peer input/output transactions. In particular embodiments, PIO write transactions are valid only if data size field 220 of command word section 210 is 0x0, indicating 8-bytes, or 0x3, indicating up to 128-bytes. Requests for PIO writes with the data size field 220 set to a different value may result in a response message with error field 224 set to one or the request message being discarded.

In these embodiments, host computer module 20 and remote computer module 30 use a PIO 8-byte Write transaction to write up to 8-bytes of data into a register. The transaction includes a PIO 8-Byte Write Request message and a PIO 8-Byte Write Response message with matching transaction numbers.

The PIO 8-byte Write Request message is a two-FLIT message. Valid portions of this message include command word section 210, message head section 230, and a portion of the second FLIT, which contains the data. Command word section 210 includes the fields illustrated in FIG. 4. Destination ID field 212 and source ID field 214 contain identifiers depending on which computer module is producing the write request, as discussed previously. Message type field 220 is 0x2, which indicates that the message is a write request, and transaction number field 218 contains a valid transaction number for the write request. Data size field 220 is 0x0, which indicates that the message contains an 8-byte double word of register data, and PIO transaction field is one, which indicates a PIO transaction. Error field 224 is zero, because error should not be asserted for request messages. Message head section 230 includes byte enable field 232 and address field 238. Byte enable field 232 indicates which bytes of the register data are valid, and address field 238 contains the 56-bit address of the register to which the data is to be written. For this type of transaction, the address should be aligned on 8-byte boundaries, i.e., address bytes [2:0] should be zero.

The write response message is a one-FLIT message. The valid portion of this message is command word section 210. Command word section 210 includes the fields illustrated in FIG. 4. Destination ID field 212 and source ID field 214 contain identifiers depending on which computer module is producing the response, as discussed previously. Message type field is 0x3, which indicates that the message is a write response, and transaction number field 218 contains the same transaction number that was used for the corresponding PIO write request message. Data size field 220 is 0x0, which indicates that the request message contains 8-bytes of register data, and PIO transaction field is one, which indicates a PIO transaction. Error field 224 is valid and, if equal to one, indicates that an error occurred during the bus transaction.

For larger writes of data between computer modules, a PIO Partial Cache-Line Write transaction may be used. In particular embodiments, up to 128-bytes of data may be written into the register of another computer module. In these embodiments, this transaction consists of a PIO Partial 128-byte Write Request message and a PIO Partial 128-byte Write Response message with matching transaction numbers.

The PIO Partial 128-byte Write Request message is a ten-FLIT message. Valid portions of this message are command word section 210, message head section 230, the byte enable field in the second FLIT, and the 128-bytes of register data in the last eight FLITS. Command word section 210 includes the fields illustrated in FIG. 4. Destination ID field 212 and source ID field 214 contain identifiers depending on which computer module is producing the write request, as discussed previously. Message type field 216 is 0x2, which indicates that the message is a write request, and transaction number field 218 contains a valid transaction number for the write request. Data size field 220 is 0x3, which indicates the message contains up to 128-bytes of register data. PIO transaction field is one, indicating a PIO transaction, and error field 224 is zero, because errors should not be asserted for request messages. Message head section 230 includes address field 238, which contains a 56-bit address for the register in which the data is to be written. For this type of transaction, the address should be aligned on 128-byte boundaries, i.e., address bits [6:0] should be zero. The second FLIT of the write request includes the 128-bit byte enable field, which indicates which bytes of the register write data, contained in the third through tenth FLITS, are valid.

The write response message is a one-FLIT message. The valid portion of this message is command word section 210. Command word section 210 contains the field illustrated in FIG. 4. Destination ID field 212 and source ID field 214 contain identifiers depending on which computer module is producing the write response, as discussed previously. Message type field 216 is 0x3, which indicates that the message is a write response, and transaction number field 218 contains the same transaction number that was used for the corresponding write request message. Data size field 220 is 0x3, which indicates that the request message contains up to 128-bytes of register data, and PIO transaction field 222 is one, which indicates a PIO transaction. Error field 224 is valid and, if equal to one, indicates that an error occurred during the processing of the bus transaction.

A memory write transaction may be used to write data from one computer module to the non-processor memory of another computer module. The transaction consists of a write request message and write response message. In particular embodiments, memory write transactions are valid only if data size field 220 of command word section 210 is 0x2, indicating a full 128-bytes, or 0x3, indicating a partial 128-bytes. Transaction request messages for memory writes with the data size field set to a different value may result in a response message with error field 224 set to one or the write request message being discarded.

For writes of up to 128-bytes of data, the transaction consists of a Partial 128-byte Memory Write Request message and a Partial Memory 128-byte Write Response message with matching transaction numbers. In certain embodiments, remote computer module 30 uses this type of write transaction to write up to 128-bytes of data into the system memory of the host computer module 20.

The Partial Memory 128-byte Write Request message is a ten-FLIT message. Valid portions of this message include command word section 210, message head section 230, the 128-bit byte enable field in the second FLIT, and the data in the last eight FLITS. Command word section 210 includes the fields illustrated in FIG. 4. Destination ID field 212 and source ID field 214 contain identifiers depending on which computer module is producing the write request, as discussed previously. Message type field 216 is 0x2, which indicates that the message is a write request, and transaction number field 218 contains a valid transaction number for the write request. Data size field 220 is 0x3, which indicates that the message contains a partial 128-bytes of write data. PIO transaction field 222 is zero, which indicates a non-processor memory transaction, and error field 224 is zero, because errors should not be asserted for request messages. Message head section 230 includes address field 238, which contains the 56-bit address to which the data is to be written in system memory. For this type of transaction, the address should be aligned on 128-byte boundaries, i.e., address bits [6:0] should be zero. The second FLIT of the write request message contains the 128-bit byte enable field, which indicates the bytes of the written data that are valid. In certain embodiments, if all of the byte enable bits are one, or if all the byte enable bits are zero, error warning information is logged in the system, but error field 224 is not one in the response message. The last eight FLITs contain the up to 128 bytes of data to be written.

The write response message is a one-FLIT message. The valid portion of this message is command word section 210. Command word section 210 includes the fields illustrated in FIG. 4. Destination ID field 212 and source ID field 214 contain identifiers depending on which computer module is producing the write response, as discussed previously. Message type field is 0x3, which indicates that the message is a write response, and transaction number field 218 contains the same transaction number that was used for the corresponding write request message. Data size field 220 is 0x3, which indicates that the request message contained 128-bytes of memory data. PIO transaction field 222 is zero, which indicates a non-processor memory transaction, and error field 224 is valid and, if equal to one, indicates that an error occurred during the processing of the bus transaction.

A Full Memory 128-byte Write transaction is used to write 128-bytes of data into the system memory of another computer module. In certain embodiments, remote computer module 30 uses this type of transaction to write 128-bytes of data into the system memory of host computer module 30. This transaction consists of a Memory Full 128-Byte Write Request message and a Memory Full 128-Byte Write Response message with matching transaction numbers.

The write request message for this transaction is a nine-FLIT message. Valid portions of the message are the command word section 210, message head section 230, and the following 8 FLITS, which contain the 128-bytes of write data. Command word section 210 includes the fields illustrated in FIG. 4. Destination ID field 212 and source ID field 214 contain identifiers depending on which computer module is producing the write request, as discussed previously. Message type field 216 is 0x2, which indicates that the message is a write request, transaction number field 220 contains a valid transaction number for the write request, and data size field 220 is 0x2, which indicates that the message contains a full 128-bytes of write data. PIO transaction field 222 is zero, which indicates a non-processor memory transaction, and error field 224 is zero, because error signals should not be asserted for request message messages. Message head section 230 includes address field 238, which contains the 56-bit address to which the data is to be written in system memory. For this type of transaction, the address should be aligned on 128-byte boundaries. The remaining eight FLITS contain the 128-bytes of data.

The write response message for this transaction is a one-FLIT message. The valid portion of this message includes command word section 210. Command word section 210 includes the fields illustrated in FIG. 4. Destination ID field 212 and source ID field 214 contain identifiers depending on which computer module is producing the write response, as discussed previously. Message type field is 0x3, which indicates that the message is a write response. Transaction number field 218 contains the same transaction number that was used for the corresponding write request message. Data size field 220 is 0x2, which indicates that the write request message contains 128-bytes of memory data, and PIO transaction field 222 is zero, which indicates a non-processor memory transaction. Error field 224 is valid and, if equal to 1, indicates that an error occurred during the processing of the bus transaction.

Another type of bus transaction that may be implemented using signal transport device 40 is an atomic memory operation (AMO). In particular embodiments, two types of AMO transactions may be performed: 1) fetch, in which an indivisible read-modify-write operation may be performed on data in memory; and 2) store, in which an indivisible read-merge-write operation is performed on data in memory. During a Fetch AMO transaction, the requested computer module returns data read from memory to the requesting computer module and modifies the data in memory by incrementing the value of the data, decrementing the value of the data, or clearing the value of the data. During a Store AMO transaction, the requested computer module reads data from memory, merges the data with data from a store AMO request message, and writes the result back into memory location in one indivisible operation.

In particular embodiments, remote computer module 30 uses a Fetch AMO transaction and a Store AMO transaction to modify the data in the non-processor memory of host computer module 30. The Fetch AMO transaction consists of a Fetch AMO Request message and a Fetch AMO Response message with matching transaction numbers.

The Fetch AMO Request message is a one-FLIT message. Valid portions of this message include command word section 210 and message head section 230. Command word section 210 includes the fields illustrated in FIG. 4. Destination ID field 212 and source ID field 214 contain identifiers depending on which computer module is producing the request message, as discussed previously. Message type field 216 is 0x6, which indicates that the message is a Fetch AMO Request message, and transaction number field 218 contains a valid transaction number for the request message. Data size field 220 is 0x0, which indicates that the message is a request for 8-bytes data, and PIO transaction field 224 is zero, which indicates a non-processor memory transaction. Requests for Fetch AMO transactions with the data size field set to a value other than 0x0 may result in a response message with the error field set to one or the request message being discarded. Read type field 226 is zero, because is not used, and error field 224 is zero, because errors should not be asserted for request messages. Message head section 230 includes byte enable field 232 and address field 238. Byte enable field 232 enables an entire 64-bit double word in memory, or enables the upper half or lower half of the 64-bit double word in memory, as discussed earlier. Table 10 specifies the values of the byte enable field 232 for this type of AMO for these embodiments. Values in byte enable field 232 other than those in Table 10 may not be supported. The requesting computer module may keep track of the value of byte enable field 232, because it may not returned in the response message. Address field 238 specifies the 64-bit double word in memory where the Fetch AMO transaction will be performed and selects the type of Fetch AMO operation to perform. Bits [55:6] of the field point to a 64-byte-aligned location in memory. In this location, double word zero contains the current operand for a Fetch AMO transaction and double word one contains the previous operand for a Fetch AMO transaction (or double word one contains the current operand and double word zero contains the previous operand, depending upon whether the addressing mode is Big Endian or Little Endian). Double words two through seven are not used and are not modified by AMO transactions. Bits [5:3] of the field indicate the type of Fetch AMO to perform, as shown in Table 11.

TABLE 10

| Byte Enable Value | Description |
| --- | --- |
| 0x0F | The least-significant 32-bits of the 64-bit memory location are enabled for the Fetch AMO transaction. |
| 0xF0 | The most-significant 32-bits of the 64-bit memory location are enabled for the Fetch AMO transaction. |
| 0xFF | All 64-bits of the memory location are enabled for the Fetch AMO transaction. |

TABLE 11

| Address Bits [5:3] | Fetch AMO Operation |
| --- | --- |
| 000 | Fetch old data with no additional operation to create new data. |
| 001 | Fetch old data and create new data by incrementing the value of the data. Write the new data to memory. |
| 010 | Fetch old data and create new data by decrementing the value of the data. Write the new data to memory. |

TABLE 11-continued

| Address Bits [5:3] | Fetch AMO Operation |
| --- | --- |
| 011 | Fetch old data and clear the data in memory by writing zero to memory. |
| 1xx | Reserved - Bit 5 of the Address field should be zero. The data is not modified. |

The Fetch AMO Response message is also a one-FLIT message. Valid portions in this message are command word section 210 and message head section 230. Command word section 210 includes the fields illustrated in FIG. 4. Destination ID field 212 and source ID field 214 contain identifiers depending on which computer module is producing the response message, as discussed previously. Message type field 216 is 0x7, which indicates that the message is a Fetch AMO Response, and transaction number field 218 contains the same transaction number that was used for the corresponding request message. Data size field 220 is 0x0, which indicates that the message contains an 8-byte double word of data. PIO transaction field 222 is zero which indicates a non-processor memory transaction, and read type field 226 is zero, because it is not used. Error field 224 is valid and, if equal to one, indicates that an error occurred during the processing of the bus transaction. Message head section 230 includes data fields 236, which contain the 8-bytes of fetch data for the response message. The requesting computer module should keep track of which bytes of this data are valid based on the request message that it originally created.

For the Store AMO transaction, the Store AMO Request message is a two-FLIT message. Valid portions of this message are command word section 210, message head section 230, and the portion of the second FLIT that contains the data. Command word section 210 contains the fields illustrated in FIG. 4. Destination ID field 212 and source ID field 214 contain identifiers depending on which computer module is producing the response message, as discussed previously. Message type field 216 is 0x8, which indicates the message is a Store AMO Request, and transaction number field 218 contains a valid transaction number for the request. Data size field 220 is 0x0, which indicates that the message contains an 8-byte double word of data. PIO transaction field 222 is zero, which indicates a non-processor memory transaction, and read type field 226 is zero, because it is not used. Error field 224 is also zero, because errors should not be asserted for request messages. Message head section 230 includes byte enable field 232 and address field 238. Byte enable field 232 enables an entire 64-bit double word in memory, or enables the upper-half or lower-half of the 64-bit double word in memory. Table 12 specifies the valid values for byte enable field 232 for these embodiments; byte enable values other than those in Table 12 are not supported. Address field 238 contains the address of the 64-bit double word in memory where the store AMO will be performed. Bits [55:6] of the field point to a 64-byte-aligned location in memory. In this location, double word zero contains the current operand for a Store AMO transaction and double word one contains the previous operand for a Store AMO transaction, or double word one contains the current operand and double word zero contains the previous operand, depending upon whether the addressing mode is Big Endian or Little Endian. Double words two through seven are not used and are not modified by AMO transactions. Bits [5:3] of the field indicate the type of Store AMO to perform, as illustrated in Table 13.

TABLE 12

| Byte Enable Value | Description |
|---|---|
| 0x0F | The least-significant 32-bits of the 64-bit memory location are enabled for the Store AMO transaction; therefore, bits [31:0] of the data field are valid in the Store AMO Request message. |
| 0xF0 | The most-significant 32-bits of the 64-bit memory location are enabled for the Store AMO transaction; therefore, bits [63:32] of the data field are valid in the Store AMO Request message. |
| 0xFF | All 64-bits of the memory location are enabled for the Store AMO transaction; therefore, bits [63:0] of the data field are valid in the Store AMO Request message. |

TABLE 13

| Address Bits [5:3] | Store AMO Operation |
|---|---|
| 000 | Directly store the data from the request message into the memory location. |
| 001 | Add the data from the request message to the current value of the memory location and then store the result into the memory location. |
| 010 | Subtract the data from the request message from the current value of the memory location and then store the result into the memory location. |
| 011 | Perform a logical AND of the data from the request message and the current value of the memory location and then store the result into the memory location. |
| 100 | Perform a logical OR of the data from the request message and the current value of the memory location and then store the result into the memory location. |
| 101 | Reserved - Data is not modified. |
| 110 | Reserved - Data is not modified. |
| 111 | Reserved - Data is not modified. |

The response message is also a one-FLIT message. The valid portion of the response message is command word section 210. Command word section 210 includes the fields illustrated in FIG. 4. Destination ID field 212 and source ID field 214 contain identifiers depending on which computer module is producing the response message, as discussed previously. Message type field 216 is 0x9, which indicates the message is a Store AMO Response, and transaction number field 218 contains the same transaction number that was used for the corresponding request message. Data size field 220 is 0x0, which indicates that the request message contained an 8-byte double word of data. PIO transaction field 222 is zero, indicating a non-processor memory transaction, and read type field 226 is zero, because it is not used. Error field 224 is valid and, if equal to one, indicates that an error occurred during the processing of the bus transaction.

Another type of data transfer that may be implemented using signal transport 15 device 40 is a Graphics Write transaction. Using the Graphics Write transaction, computer modules may send graphics data by a dedicated, higher bandwidth method. In particular embodiments, Graphics Write transactions are used to send graphics data to remote computer module 30. In addition, remote computer module 30 may use a Graphics Write transaction to send graphics data to another remote computer module. Graphics Write transactions may or may not be ordered with respect to PIO Read or Write transactions.

In general, Graphics Write transactions include Graphics Write Request messages and Graphics Write Response messages, although in the certain embodiments, individual Graphics Write Request messages do not require an associated response message. In addition, Graphics Write Request messages are always accepted and will not be rejected with a no acknowledgement. Particular embodiments include Graphics 8-byte Write transactions, Graphics Partial 128-byte Write transactions, and Graphics Full. 128-byte Write transactions.

A Graphics 8-byte Write transaction includes a Graphics 8-byte Write Request-message and, possibly, a Graphics Credit Response message or a Graphics Write Error Response message. Host computer module 20 may use the Graphics 8-byte Write transaction to write up 8-bytes of graphics data to remote computer module 30, and remote computer module 30 may use the transaction to write up to 8-bytes of graphics data to another remote computer module.

The Graphics 8-byte Write Request message contains two FLITS. Valid portions of this message are command word section 210, message head section 230, and the data portion of the second FLIT. Command word section 210 includes the fields illustrated in FIG. 4. Destination ID field 212 and source ID field 214 contain identifiers depending on which computer module is producing the request message, as discussed previously. Message type field 216 is 0xA, which indicates that the message is a graphics write request, and transaction number field 218 is zero, because it is not used. Data size field 220 is 0x0, which indicates that the message contains an 8-byte double word of data. PIO transaction field 222 is one, indicating a PIO transaction, and error filed 224 is zero, because errors should not be asserted for request messages. Message head section 230 includes byte enable field 232 and address field 238. Byte enable field 232 indicates which bytes of the graphics write data are valid. Address field 238 contains the address for the graphics data write. When host computer module 20 creates the write request message, the address may be derived from the address pins of a processor. Bits [6:3] indicate the first quad word location for the graphics write. Remote computer module 20 may or may not utilize this address.

A possible response to the Graphics 8-byte Write Request message is a Graphics Credit Response message. This message contains one-FLIT, and the valid portions are command word section 210 and message head section 230. Command word section 210 includes the fields illustrated in FIG. 4. Destination ID field 212 and source ID field 214 contain identifiers depending on which computer module is producing the response message, as discussed previously. Message type field 216 is 0xB, which indicates that the message is a Graphics Credit Response. Transaction number field 218 is zero because it is not used, and data size field 220 is zero because it is not used. PIO transaction field 22 is one, indicating a PIO transaction, and error 224 is valid and, if equal to one, which would make the message a Graphics Write Error Response message, indicates an error occurred during the processing of the bus transaction and that the credits are invalid. Conditions that would cause an error response include the remote computer module receiving more Graphics Write Request messages than there is available room for, or the remote computer module receiving a Graphics Write Request message with an address which is not supported. Additionally, read type field 226 is 0x0, because it is not used. Message head section 230 includes graphics credit field 234, which indicates the number of graphics credits available to the requesting computer module, each credit equal to one 64-bit double word of graphics data. The first FLIT of a graphics request message does not need to count toward the graphics credit value, however.

To write more than 8-bytes of graphics data, a Graphics Partial 128-byte Write transaction may be used. This transaction may consist of only a Graphics Partial 128-byte Write Request message, although an appropriate Graphics Credit Response message or Graphics Write Error Response message may be used.

The Graphics Partial 128-byte Write Request message has nine FLITS, and command word section 210, message head section 230, and the entirety of the second through ninth FLITS are the valid portions. Command word section 210 includes the fields illustrated in FIG. 4. Destination ID field 212 and source ID field 214 contain identifiers depending on which computer module is producing the request message, as discussed previously. Message type field 216 is 0xA, which indicates the message is a graphics write request, and data size field 220 is 0x3, which indicates that the message contains a partial 128-bytes of graphics data. Transaction number field 218 is zero because transaction numbers are not used, and read type field 226 is zero because it is also not used. PIO transaction field 222 is one, which indicates a PIO or graphics transaction, and error field 224 is zero because errors should not be asserted for request messages. Message head section 230 includes byte enable field 232 and address field 238. Byte enable field 232 indicates the number of valid bytes in the second through ninth FLITS, as illustrated in Table 7. Note that if byte enable field 232 is 0x1, 0x2, or 0x3, data size field 220 should be 0x3, to indicate a partial 128-bytes of data. Address field 238 contains the address for the graphics data write.

One possible response message is the Graphics Credit Response message. Such a message is one FLIT in size and has command word section 210 and message head section 230 as the valid portions. Command word section 210 includes the fields illustrated in FIG. 4. Destination ID field 212 and source ID field 214 contain identifiers depending on which computer module is producing the request message, as discussed previously. Message type field 216 is 0xB, which indicates that the message is a graphics credit response. Transaction number field 218, data size field 220, and read type field 226 are zero because they are not used. PIO transaction field 222 is one, indicating a PIO transaction, and error field 224 is valid and, if equal to one, which would make the message a Graphics Write Error Response message, indicates that an error occurred during the processing of the bus transaction and that the credit count is not valid. An error may occur if the remote computer module receives more graphics write requests messages than there is available space for, or if the remote computer module receives a graphics write request message with an address that is not supported. Message head section 230 includes graphics credit field 234, which indicates the number of graphics credits available to the requesting computer module. Each graphics credit is equal to one 64-bit double word of graphics data. Note that the first FLIT of a graphics request message does not need to be counted towards the graphics credit value.

A Graphics Full 128-byte Write Request transaction may be used to write 128-bytes of graphics data. The Graphics Full 128-byte Write Request message has nine FLITS, and command word section 210, message head section 230, and the entirety of the second through ninth FLITS are the valid portions. Command word section 210 includes the fields illustrated in FIG. 4. Destination ID field 212 and source ID field 214 contain identifiers depending on which computer module is producing the request message, as discussed previously. Message type field 216 is 0xA, which indicates the message is a graphics write request, and data size field 220 is 0x2, which indicates that the message contains a full 128-bytes of graphics data. Transaction number field 218 is zero because transaction numbers are not used, and read type field 226 is zero because it is also not used. PIO transaction field 222 is one, which indicates a PIO or graphics transaction, and error field 224 is zero because errors should not be asserted for request messages. Message head section 230 includes byte enable field 232 and address field 238. Byte enable field 232 indicates the number of valid bytes in the second through ninth FLITS, as illustrated in Table 7. Note that if byte enable field 232 is 0x4, data size field 220 should be 0x3, to indicate a full 128-bytes of data. Address field 238 contains the address for the graphics data write.

One possible response message is the Graphics Credit Response message. Such a message is one FLIT in size and has command word section 210 and message head section 230 as the valid portions. Command word section 210 includes the fields illustrated in FIG. 4. Destination ID field 212 and source ID field 214 contain identifiers depending on which computer module is producing the request message, as discussed previously. Message type field 216 is 0xB, which indicates that the message is a graphics credit response. Transaction number field 218, data size field 220, and read type field 226 are zero because they are not used. PIO transaction field 222 is one, indicating a PIO transaction, and error field 224 is valid and, if equal to one, which would make the message a Graphics Write Error Response message, indicates that an error occurred during the processing of the bus transaction and that the credit count is not valid. An error may occur if the remote computer module receives more graphics write requests messages than there is available space for, or if the remote computer module receives a graphics write request message with an address that is not supported. Message head section 230 includes graphics credit field 234, which indicates the number of graphics credits available to the requesting computer module. Each graphics credit is equal to one 64-bit double word of graphics data. Note that the first FLIT of a graphics request message does not need to be counted towards the graphics credit value.

Another type of bus transaction that may be implemented using system 10 is an Invalidate-Cache Flush transaction, which may be used to indicate that a copy of data is no longer valid. In particular embodiments, host computer module 20 uses such a transaction to inform remote computer module 30 that a copy of data is no longer valid.

This transaction may consist only of an Invalidate-Cache Flush Request message, which may consist of one FLIT. Valid portions of the message are command word section 210 and message head section 230. Command word section 210 includes the fields illustrated in FIG. 4, except that the destination ID and the source ID are not defined. Message type field 216 is 0xD, which indicates that the message is an Invalidate-Cache Flush Request. Transaction number field 218, data size field 220, and read type field 226 are zero because they are not used. PIO transaction field 222 is zero, to indicate a non-processor memory transaction. Error field 224 is zero, because the error should not be asserted for request messages. Message head section 230 includes address field 238, which indicates the address of the data that, if stored in the remote computer module, should be marked as invalid.

In operation, flow control is used to manage the conveyance of data across signal transport device 40. Additionally, interrupts, resets, barriers, and error correction codes are used in the conveyance of data.

In particular embodiments, flow control of messages on signal transport device 40 is based on credits. In general, a credit is an indication from a first computer module to a second computer module that the first computer module has room in its buffers to receive at least a portion of a certain type of message. Note that a portion may, for instance, be sized to transfer on the appropriate one of link set 41 and link set 53 in one clock period in the embodiment illustrated in FIG. 1, each link in the appropriate set carrying part of the portion. For example, if a portion contains 128-bits in the embodiment illustrated by FIG. 1, a portion may be transferred by sending two bits on each link at a double data rate. In certain embodiments, flow control is different for host computer module 20 to remote computer module 30 transfers than it is for remote computer module 30 to host computer module 20 transfers.

For example, for host computer module 20 to remote computer module 30 transfers, credit-based flow control may be performed on PIO-transaction request messages sent from host computer module 20 to remote computer module 30. Graphics write request messages and invalidate-cache flush request messages may be automatically accepted by remote computer module 30 and, hence, do not require credit-based flow control. When remote computer module 30 receives a message, it examines command word section 210 to determine whether the message is of a type that requires credit-based flow control.

To implement this credit-based flow control, remote computer module 30 includes credit generator 38, and host computer module 20 includes credit counter 28, as illustrated in FIG. 1. Credit generator 38 controls when remote computer module 30 sends request credit signal 150, which is transferred on link 50, to credit counter 28 of host computer module 20. When the request credit signal is asserted during a channel clock period, it indicates that remote computer module 30 has room in request buffer 34 for another complete PIO-transaction request message from host computer module 20.

Credit generator 38 maintains a count of the number of request credits sent by remote computer module 30 to host computer module 20. In certain embodiments, this count is maintained in a memory-mapped register. When the request credit signal is asserted during a channel clock period, remote computer module 30 increments the request credit count by one. When, however, remote computer module 30 receives a complete PIO-transaction request message, remote computer module 30 decrements the request credit count by one. In particular embodiments, credit generator 38 has a programmable limit for the number of request credits that remote computer module 30 can send to host computer module 20. The request credit limit is stored in a memory mapped register. When the value of the request credit count is equal to the value of the request credit limit, credit generator 38 does not allow remote computer module 30 to assert the request credit signal. When, however, the value of the request credit count and less than the value of the request credit limit, credit generator 38 allows remote computer module 30 to assert the request credit signal.

Credit counter 28 may be a counter that tests for zero and for overflow of the credit count. In a particular embodiment, credit counter 28 is a four-bit counter. When the request credit signal is asserted during a channel clock period, credit counter 28 increments the credit count by one. When, however, a complete PIO-transaction request message transfers from host computer module 20 to remote computer module 30, the credit count is decremented by one. If the credit count is zero, host computer module 20 does not send a PIO-transaction request message to remote computer module 30 until the remote computer module 30 sends the request credit signal to host computer module 20.

It should be noted that, although they could be, response messages are not subject to flow control in these embodiments. When remote computer module 30 creates a request message, it automatically reserves space in response buffer 35 (for the corresponding response message.

For transfers from remote computer module 30 to host computer module 20, credit-based flow control may be performed on all request messages. To implement the flow control for request messages from remote computer module 30 to host computer module 20, host computer module 20 includes credit generator 26 and remote computer module includes credit counter 36. Credit generator 26 is responsible for controlling when host computer module 20 asserts credit request signal 162, which is transferred to remote computer module 30 on link 62. When the request credit signal is asserted during a channel clock period, it indicates that host computer module 20 has room in its request buffer 25 for another 128-bit FLIT of a request message from remote computer module 30.

Credit generator 26 maintains a count of the number of request credits that host computer module 20 has sent to remote computer module 30. When the request credit signal is asserted during a channel clock period, host computer module 20 increments the request credit count by one. When, however, host computer module receives a 128-bit FLIT of a request message, host computer module 20 decrements the request credit count by one.

Credit counter 36 in remote computer module 30 tests for a credit count of zero and an overflow of the credit count. When the request credit signal is asserted during a channel clock period, credit counter 36 increments the request credit count by one. When, however, a 128-bit FLIT of a request message transfers from remote computer module 30 to host computer module 20, the credit count is decremented by one. If the credit count is zero, remote computer module 30 does not send a request message to host computer module until host computer module asserts the request credit signal during a channel clock period. In particular embodiments, remote computer module 30 is capable of counting at least thirty-two request credits from host computer module 20.

Credit based flow control may also be performed on response messages sent from remote computer module 30 to host computer module 20. The major components of this flow control are credit generator 26 and credit counter 36. Credit generator 26 is responsible for controlling when host computer module 20 sends a response credit signal to remote computer module 30. When the response credit signal is asserted during a channel clock period, it indicates that host computer module 20 has room in response buffer 25 for another 128-bit FLIT of a response message from remote computer module 30.

In operation, credit generator 26 maintains a count of the number of response credits that host computer module 20 sends to remote computer module 30. When the response credit signal is asserted during a channel clock period, host computer module 20 increments the response credit count. When, however, host computer module 20 receives a 128-bit FLIT of a response message, host computer module 20 decrements the response credit count. Credit counter 36, in turn, tests for whether the response credit count is zero. Also, when the response credit signal is asserted during a channel clock period, credit counter 36 increments the response credit count, and when a 128-bit FLIT of a response message transfers from remote computer module 30 to host computer module 20, credit counter 36 decrements the response credit count. If the credit count is zero, remote computer module 30 does not send a response message until host computer module 20 asserts the response credit signal. In particular embodiments, remote computer module 30 should be capable of counting at least thirty-two response credits from host computer module 20.

FIG. 7 is a flowchart 700 illustrating a method for conveying data in accordance with one embodiment of the present invention. The method begins at decision block 704 with determining whether a request credit has been received. The request credit could be from a host computer module or a remote computer and could indicate that all or a portion of a transaction request message may be sent. The request credit could be conveyed in the form of a signal, a message, or other appropriate format.

If a request credit has been received, the method calls for determining whether the number of request credits has reached a limit at decision block 708. The limit on the number of request credits may be established a priori or be dynamic, possible based on the amount of available memory. If the number of request credits has reached its limit, the method calls for returning to decision block 704. If, however, the number of request credits has not reached its limit, the method calls for incrementing a request credit counter at function block 712. The counter may be implemented in hardware or software and indicates the number of transaction request messages, or portions thereof, that may be sent. The method then calls for returning to decision block 704.

If a request credit has not been received at decision block 704, the method calls for determining whether a transaction request message is to be sent at decision block 716. A transaction request message could, for example, specify a read of data from non-processor memory, a write data to non-processor memory, a read of data from processor memory, a write of data to processor memory, an atomic memory operation, and/or any other appropriate type of operation. If a transaction request is not to be sent, the method calls for returning to decision block 704. But if a transaction request is to be sent, the method calls for determining whether a request credit is available at decision block 720. Typically, determining whether a request credit is available may be ascertained by examining the value of the request credit counter, a value greater than zero indicating that a request message may be sent.

If a request credit is not available, the method calls for returning to decision block 704. If, however, a request credit is available, the method calls for facilitating sending of the transaction request message, or a portion thereof, at function block 724. This operation may involve informing a component that the message may be sent, initiating the sending of the message, actually sending the message, and/or any other appropriate operation. The method then calls for waiting for the transaction request message, or portion thereof, to be sent at decision block 728. Once the transaction request message, or portion thereof, has been sent, the method calls for decrementing the request credit counter at function block 732 and returning to decision block 704.

While flowchart 700 illustrates a method for conveying data in accordance with one embodiment of the present invention, other embodiments may contain fewer, more, and/or a different arrangement of operations. For example, in certain embodiments, the request credit counter may be decremented before or while the transaction request message is sent. As another example, in particular embodiments, determining whether a transaction request message is to be sent may occur before determining whether a request credit has been received. As an additional example, in some embodiments, the limit on the number of request credits may not be checked. As a further example, in certain embodiments, a message may be generated indicating that a transaction request message cannot be sent because no request credits are available. A variety of other examples exist.

FIG. 8 is a flowchart illustrating a method for conveying data in accordance with one embodiment of the present invention. The method begins at decision block 804 with determining whether room is available for at least a portion of a transaction request message. The determination may involve taking into account any transaction request credits previously extended, a transaction request credit indicating that there is room for at least part of a transaction request message.

If room is available, the method calls for determining whether the number of extended transaction request credits has reached its limit at decision block 808. The amount of request credits may be set a priori or dynamically, possible based on the amount of room available. If the number of extended request credits is at its limit, the method calls for returning the decision block 804. If, however, the number of extended request credits is not at its limit, the method calls for initiating a transaction request credit at function block 812. The transaction request credit could be conveyed by a signal, a message, or any other appropriate format and could indicate that at least a portion of a transaction request message may be sent. The method then calls for incrementing a request credit counter at function block 816. The request credit counter could be implemented in hardware or software. The method then returns to decision block 804.

If no room is available for a transaction request message, or a portion thereof, at decision block 804, the method calls for determining whether a transaction request message, or a portion thereof, has been received at decision block 820. If a transaction request message has not been received, the method calls for returning to decision block 804. If, however, a transaction request message has been received, the method calls for decrementing the request credit counter at function block 824. The method then calls for returning to decision block 804.

While flowchart 800 illustrates a method for conveying data in accordance with one embodiment of the present invention, other embodiments may include fewer, more, and/or a different arrangement of operations. For example, in certain embodiments, determining whether a transaction request has been received may occur before determining whether there is room for a transaction request. As another example, in particular embodiments, the limit on the number of extended transaction request credits may not be used. As a further example, in some embodiments, the method may include receiving a transaction response message, which does not affect the transaction request credits. A variety of other examples exist.

Note that while flowcharts 700 and 800 have discussed embodiments implementing transaction request credits, other embodiments could include the use of transaction response credits similar to the transaction request credits. This credit scheme could be used in conjunction with or to the exclusion of the transaction request credit scheme described above.

Another type of bus transaction that occurs on signal transport device 40 is an interrupt. When an error occurs in remote computer module 30, remote computer module 30 sends an interrupt to host computer module 20 to indicate that an error occurred. In particular embodiments, the error must be enabled as a trigger for an interrupt. Because signal transport device 40 does not have a dedicated signal to transfer interrupts from remote computer module 30 to host computer module 20, however, remote computer module 30 may send an interrupt to host computer module 20 using a write interrupt transaction. In particular embodiments, remote computer module 30 uses a PIO 8-byte Write Interrupt transaction to assert one bit in a 256-bit interrupt register located in a destination processor node or in host computer module 20. The interrupt transaction consists of a PIO 8-byte Write Request message and a PIO 8-byte Write Response message with matching transaction numbers. In certain embodiments, however, before initiating an interrupt transaction, remote computer module 30 must perform a barrier operation, to be discussed in more detail below, to make sure that all other outstanding PIO or memory write requests have finished.

The PIO 8-byte Write Request message is a two-FLIT message. Valid portions of this message include command word section 210, message head section 230, and half of the second FLIT. Command word section 210 contains the fields illustrated in FIG. 4. Destination ID field 212 and source ID field 214 contain identifiers depending on which computer module is producing the request message, as discussed previously. Message type field 216 is 0x2, which indicates that the message is a write request. Transaction number field 218 contains a valid transaction number for the write request. Data size field 220 is 0x0, which indicates that the message contains an 8-byte double word of data. PIO transaction field 222 is one, indicating a PIO transaction, and error field 224 is zero, because errors should not be asserted for request messages. Message head section 230 includes byte enable field 232 and address field 238. Byte enable field 232 indicates which bytes of the write data are valid. For interrupt request messages, byte enable field 232 should be set to 0xFF to indicate that all of the bytes in the data field are valid. Address field 238 contains the address of the 256-bit interrupt processor memory location to be written to. The data field of the second FLIT contains an interrupt vector and an interrupt status bit. The interrupt vector is an 8-bit value located in bits [7:0] of the data field. The interrupt status bit is located in bit [8] of the data field. Bits [63:9] of the data field are zero. The interrupt vector identifies one of the 256-bits in the destination processor memory. The interrupt status bit indicates that the bit identified by the interrupt vector is one. For an interrupt write request, bit [8] of the data field is always one.

The PIO 8-byte Write Response message is a one-FLIT message. The valid portions of this message include command word section 210. Command word section 210 includes the fields illustrated in FIG. 4. Destination ID field 212 and source ID field 214 contain identifiers depending on which computer module is producing the request message, as discussed previously. Message type field 216 is 0x3, which indicates that the message is a write response. Transaction number field 218 contains the same transaction number that was used for the corresponding interrupt request message. Data size field 220 is 0x0, which indicates that the request message contains 8-bytes of data, and read type field 226 is zero, because it is not used. PIO transaction field 222 is one, indicating a PIO transaction. Error field 224 is valid and, if equal to one, indicates that an error occurred during the processing of the interrupt transaction.

In certain embodiments, remote computer module 30 automatically generates the interrupt request message based on parameters stored in memory-mapped registers. These memory-mapped registers may provide the following information for interrupt generation: 1) error status for individual errors; 2) interrupt enables for individual errors; and 3) destination parameters for the interrupt request message.

When remote computer module 30 detects that an error has occurred, it asserts the appropriate bit in the memory-mapped register, which could be the Coretalk Module Error Status memory-mapped register, discussed in more detail below. For example, when remote computer module 30 detects that a single-bit error has occurred on the data signals on signal transport device 40, remote computer module 30 asserts bit zero—the Error Correction Code Single-Bit Error bit—of the error status memory-mapped register.

As mentioned previously, remote computer module 30 may generate an interrupt message for an error only when that error is enabled as a trigger for an interrupt. In particular embodiments, a memory-mapped register, such as the Coretalk Module Interrupt Enable memory mapped register, enables individual errors as a trigger for an interrupt. For example, when bit zero—the Enable Error Correction Code Single-bit Error bit—is asserted, remote computer module 30 generates an interrupt when the ECC Single-bit Error bit of the Coretalk Module Error Status register changes from a zero to a one. When, however, the Enable ECC Single-bit Error bit is zero, remote computer module 30 does not generate an interrupt when the ECC Single-bit Error bit of the Coretalk Module Error Status register changes from a zero to a one.

The interrupt request message may require parameters for the address and data fields of the message. This information may be stored in a memory-mapped register of remote computer module 30, such as the Coretalk Module Interrupt Destination memory mapped register. The address specifies an interrupt register located in a processor node or host computer module 20. The address field provides a means for remote computer module 30 to send an interrupt request message to host computer module 20 or to a processor node in the host computer system that is designated to handle input/output interrupts. The register may also provide an interrupt vector that is placed in the data field of the interrupt request message. The interrupt request message specifies one bit in the 256-bit destination interrupt register that is designated as the interrupt bit for remote computer module 30.

Signal transport device 40 also allows host computer module 20 to send a reset signal to remote computer module. Such a signal would be sent over link 65 in the illustrated embodiment. The reset could be active while the reset signal is asserted and could be completed when the reset signal is de-asserted. Remote computer module 30 could have a sixteen-period clock delay after the reset signal is de-asserted before it sends a request credit signal to host computer module.

Another type of bus operation is to barrier. A barrier is an operation that a computer module performs to ensure that previous bus transactions complete before a new bus transaction begins. In particular embodiments, remote computer module 30 executes a barrier operation before beginning certain types of operations, such as initiating an interrupt transaction that indicates an error occurred or initiating an interrupt transaction that indicates a memory block transfer is complete.

For a barrier for an error interrupt transaction, when an error occurs, remote computer module 30 initiates the interrupt transaction. Before sending the interrupt transaction, however, remote computer module 30 performs a barrier operation, which ensures that remote computer module receives a response for all of the outstanding requests it generated before it detected the error interrupt condition. During the barrier operation, remote computer module 30 halts the generation of new bus transactions. Additionally, remote computer module 30 monitors the number of outstanding read and write requests, which may, for example, be stored in pending read and pending write fields of a Coretalk Module Status memory-mapped register. When the pending reads and pending writes have been completed, the barrier operation is complete, and remote computer module 30 resumes the generation of new bus transactions. Accordingly, the first bus transaction that remote computer module 30 generates is the interrupt transaction for the error.

In particular embodiments, remote computer module 30 may contain logic that can be programmed to transfer large amounts of data, or blocks, to and from the non-processor memory of host computer module 20. For example, memory-mapped registers in the block-transfer logic may contain a starting address, a transfer length, an address increment value, and a read-or-write designation for the transfer. When software stores values into the memory-mapped registers, the block-transfer logic performs the associated memory transactions.

In particular embodiments, there may be an enable bit and a status bit for implementing such a transaction. For example, the Coretalk Interrupt Enable memory-mapped register may have a bit to enable the transaction, and the Coretalk Error Status memory-mapped register may have a bit to indicate when to initiate the interrupt transaction. Before sending the interrupt transaction, remote computer module 30 may perform a barrier operation, to ensure that remote computer module 30 receives a response for all the outstanding memory read or write requests that it generated before it sends the interrupt transaction for the block-transfer interrupt. During the barrier operation, remote computer module 30 may halt the generation of new read or write bus transactions and monitor the number of outstanding read or write requests, which may also be stored in appropriate fields of a memory-mapped register, such as the Coretalk Status memory-mapped register. When the pending read or writes have been completed, the barrier operation is complete, and the remote computer module resumes the generation of new read or write bus transactions, the first being the interrupt transaction for the block-transfer interrupt. Note that when a barrier operation is performed for read transactions, write transactions may proceed on signal transport device 40, and when a barrier operation is performed for write transactions, read transactions may proceed on the signal transport device.

In particular embodiments, the Error Correction Code (ECC) is an 8-bit code that covers 64-bits of data. The code may be capable of detecting and correcting single-bit errors, double-bit errors, and/or multiple-bit errors. In certain embodiments, the ECC is capable of detecting and correcting single-bit errors, detecting double-bit errors, and detecting some multiple-bit errors.

In operation, a transmitter of data on signal transport device 40 generates the ECC check bits. Table 14 lists the ECC check bit assignments for 64-bits of data for certain embodiments. The value of each check bit is derived from the parity of the data bits denoted in Table 14. For example, if Data [63:0] bits are equal to 0x0000000000000007, the ECC [7:0] bits should be equal to 0xC7.

TABLE 14

| Bits | ECC [7] | ECC [6] | ECC [5] | ECC [4] | ECC [3] | ECC [2] | ECC [1] | ECC [0] |
|---|---|---|---|---|---|---|---|---|
| Data [0] | X | X | | | | | | X |
| Data [1] | X | X | | | | | X | |
| Data [2] | X | X | | | | X | | |
| Data [3] | X | X | | | X | | | |
| Data [4] | X | | X | | | | | X |
| Data [5] | X | | X | | | | X | |
| Data [6] | X | | X | | | X | | |
| Data [7] | X | | X | | X | | | |
| Data [8] | X | | | X | | | | X |
| Data [9] | X | | | X | | | X | |
| Data [10] | X | | | X | | X | | |
| Data [11] | X | | | X | X | | | |
| Data [12] | | X | X | | | | | X |
| Data [13] | | X | X | | | | X | |

TABLE 14-continued

| Bits | ECC [7] | ECC [6] | ECC [5] | ECC [4] | ECC [3] | ECC [2] | ECC [1] | ECC [0] |
|---|---|---|---|---|---|---|---|---|
| Data [14] | | X | X | | | X | | |
| Data [15] | | X | X | | X | | | |
| Data [16] | | X | | X | | | | X |
| Data [17] | | X | | X | | | X | |
| Data [18] | | X | | X | | X | | |
| Data [19] | | X | | X | X | | | |
| Data [20] | | | X | X | | | | X |
| Data [21] | | | X | X | | | X | |
| Data [22] | | | X | X | | X | | |
| Data [23] | | | X | X | X | | | |
| Data [24] | X | X | X | X | X | | | |
| Data [25] | | X | | | X | X | X | X |
| Data [26] | | X | | X | X | | | |
| Data [27] | X | X | | X | | | | |
| Data [28] | | | | | X | X | X | |
| Data [29] | | | | | X | | X | X |
| Data [30] | X | X | X | X | | | | X |
| Data [31] | | | X | | X | X | X | X |
| Data [32] | | | X | | X | X | | |
| Data [33] | | | X | | X | X | | |
| Data [34] | | X | | | X | X | | |
| Data [35] | X | | | | X | X | | |
| Data [36] | | | X | | X | | X | |
| Data [37] | | X | | | X | | X | |
| Data [38] | | X | | | X | | X | |
| Data [39] | X | | | | X | | X | |
| Data [40] | | | X | | X | | | X |
| Data [41] | | X | | | X | | | X |
| Data [42] | | X | | | X | | | X |
| Data [43] | X | | | | X | | | X |
| Data [44] | | | X | | | X | X | |
| Data [45] | | X | | | | X | X | |
| Data [46] | | X | | | | X | X | |
| Data [47] | X | | | | | X | X | |
| Data [48] | | | X | | | X | | X |
| Data [49] | | X | | | | X | | X |
| Data [50] | | X | | | | X | | X |
| Data [51] | X | | | | | X | | X |
| Data [52] | | | X | | | | X | X |
| Data [53] | | X | | | | | X | X |
| Data [54] | | X | | | | | X | X |
| Data [55] | X | | | | | | X | X |
| Data [56] | X | | | | X | X | X | X |
| Data [57] | X | X | X | X | | X | | |
| Data [58] | | | | | | X | X | X |
| Data [59] | | | | | X | X | | X |
| Data [60] | X | X | X | | | | | |
| Data [61] | X | | X | X | | | | |
| Data [62] | | | | | X | X | X | X |
| Data [63] | X | X | X | X | | X | | |

The receiving computer module on signal transport device 40 generates ECC Syndrome bits. The value of each syndrome bit is derived from the parity of the data bits and check bits. Table 15 illustrates the assignment of Data [63:0] bits and ECC [7:0] bits to ECC syndrome bits (S[7:0]) for certain embodiments.

TABLE 15

| Bits | S [7] | S [6] | S [5] | S [4] | S [3] | S [2] | S [1] | S [0] |
|---|---|---|---|---|---|---|---|---|
| Data [0] | X | X | | | | | | X |
| Data [1] | X | X | | | | | X | |
| Data [2] | X | X | | | | X | | |
| Data [3] | X | X | | | X | | | |
| Data [4] | X | | X | | | | | X |
| Data [5] | X | | X | | | | X | |
| Data [6] | X | | X | | | X | | |
| Data [7] | X | | X | | X | | | |
| Data [8] | X | | | X | | | | X |
| Data [9] | X | | | X | | | X | |
| Data [10] | X | | | X | | X | | |

TABLE 15-continued

| Bits | S [7] | S [6] | S [5] | S [4] | S [3] | S [2] | S [1] | S [0] |
|---|---|---|---|---|---|---|---|---|
| Data [11] | X |  |  | X | X |  |  |  |
| Data [12] |  | X | X |  |  |  |  | X |
| Data [13] |  | X | X |  |  |  | X |  |
| Data [14] |  | X | X |  | X |  |  |  |
| Data [15] |  | X | X | X |  |  |  |  |
| Data [16] |  | X |  | X |  |  |  | X |
| Data [17] |  | X |  | X |  |  | X |  |
| Data [18] |  | X |  | X | X |  |  |  |
| Data [19] |  | X |  | X | X |  |  |  |
| Data [20] |  |  | X | X |  |  |  | X |
| Data [21] |  |  | X | X |  |  | X |  |
| Data [22] |  |  | X | X |  | X |  |  |
| Data [23] |  |  | X | X | X |  |  |  |
| Data [24] | X | X | X | X | X |  |  |  |
| Data [25] |  | X |  |  | X | X | X | X |
| ECC [2] |  |  |  |  |  | X |  |  |
| ECC [5] |  |  | X |  |  |  |  |  |
| Data [26] |  | X | X | X |  |  |  |  |
| Data [27] | X | X |  | X |  |  |  |  |
| Data [28] |  |  |  |  | X | X | X |  |
| Data [29] |  |  |  |  | X |  | X | X |
| Data [30] | X | X | X | X |  |  |  | X |
| Data [31] |  |  | X |  | X | X | X | X |
| ECC [3] |  |  |  |  | X |  |  |  |
| ECC [4] |  |  |  | X |  |  |  |  |
| Data [32] |  |  |  | X | X | X |  |  |
| Data [33] |  |  | X |  | X | X |  |  |
| Data [34] |  | X |  |  | X | X |  |  |
| Data [35] | X |  |  |  | X | X |  |  |
| Data [36] |  |  | X |  | X |  | X |  |
| Data [37] |  | X |  |  | X |  | X |  |
| Data [38] |  | X |  |  | X |  | X |  |
| Data [39] | X |  |  |  | X |  | X |  |
| Data [40] |  |  | X |  | X |  |  | X |
| Data [41] |  | X |  |  | X |  |  | X |
| Data [42] |  | X |  |  | X |  |  | X |
| Data [43] | X |  |  |  | X |  |  | X |
| Data [44] |  |  | X |  |  | X | X |  |
| Data [45] |  | X |  |  |  | X | X |  |
| Data [46] |  | X |  |  |  | X | X |  |
| Data [47] | X |  |  |  |  | X | X |  |
| Data [48] |  |  | X |  |  | X |  | X |
| Data [49] |  | X |  |  |  | X |  | X |
| Data [50] |  | X |  |  |  | X |  | X |
| Data [51] | X |  |  |  |  | X |  | X |
| Data [52] |  |  | X |  |  |  | X | X |
| Data [53] |  | X |  |  |  |  | X | X |
| Data [54] |  | X |  |  |  |  | X | X |
| Data [55] | X |  |  |  |  |  | X | X |
| Data [56] | X |  |  |  | X | X | X | X |
| Data [57] | X | X | X | X |  | X |  |  |
| ECC [6] |  | X |  |  |  |  |  |  |
| ECC [1] |  |  |  |  |  |  | X |  |
| Data [58] |  |  |  |  | X | X | X |  |
| Data [59] |  |  |  |  | X | X |  | X |
| Data [60] | X | X | X |  |  |  |  |  |
| Data [61] | X |  | X | X |  |  |  |  |
| Data [62] |  |  | X | X | X | X | X |  |
| Data [63] | X | X | X | X |  | X |  |  |
| ECC [7] | X |  |  |  |  |  |  |  |
| ECC [0] |  |  |  |  |  |  |  | X |

When the value of the syndrome bits is 0x00, it indicates that the values of the data bits and ECC bits are the same as they were when they were originally transmitted. In this case, no error has occurred. Note, however, that it is possible that many, for example more than five, of the data and/or ECC bits have changed value and the derived value of the syndrome bits turns out to be 0x00, which would indicate that no error occurred; this is actually a case of an undetectable error.

When the parity of the syndrome bits is odd and a three-bit or a four-bit error is not detected, it indicates that a single-bit error occurred. When the receiving computer module detects a single-bit error, it uses the syndrome bit to determine which data or ECC bit is not correct and corrects the value of that bit. The receiving computer module may also set a single-bit error bit in an error status register. Table 16 lists the values of the syndrome bits and indicates which data or ECC bit corresponds to each syndrome code for certain embodiments. For example, when the syndrome bits are set to 0xC2, it indicates that Data [1] bit one is not correct.

TABLE 16

| Bits | S [7] | S [6] | S [5] | S [4] | S [3] | S [2] | S [1] | S [0] | Syndrome Code S [7:0] |
|---|---|---|---|---|---|---|---|---|---|
| Data [0] | 1 | 1 | 0 | 0 | 0 | 0 | 0 | 1 | 0xC1 |
| Data [1] | 1 | 1 | 0 | 0 | 0 | 0 | 1 | 0 | 0xC2 |
| Data [2] | 1 | 1 | 0 | 0 | 0 | 1 | 0 | 0 | 0xC4 |
| Data [3] | 1 | 1 | 0 | 0 | 1 | 0 | 0 | 0 | 0xC8 |
| Data [4] | 1 | 0 | 1 | 0 | 0 | 0 | 0 | 1 | 0xA1 |
| Data [5] | 1 | 0 | 1 | 0 | 0 | 0 | 1 | 0 | 0xA2 |
| Data [6] | 1 | 0 | 1 | 0 | 0 | 1 | 0 | 0 | 0xA4 |
| Data [7] | 1 | 0 | 1 | 0 | 1 | 0 | 0 | 0 | 0xA8 |
| Data [8] | 1 | 0 | 0 | 1 | 0 | 0 | 0 | 1 | 0x91 |
| Data [9] | 1 | 0 | 0 | 1 | 0 | 0 | 1 | 0 | 0x92 |
| Data [10] | 1 | 0 | 0 | 1 | 0 | 1 | 0 | 0 | 0x94 |
| Data [11] | 1 | 0 | 0 | 1 | 1 | 0 | 0 | 0 | 0x98 |
| Data [12] | 0 | 1 | 1 | 0 | 0 | 0 | 0 | 1 | 0x61 |
| Data [13] | 0 | 1 | 1 | 0 | 0 | 0 | 1 | 0 | 0x62 |
| Data [14] | 0 | 1 | 1 | 0 | 0 | 1 | 0 | 0 | 0x64 |
| Data [15] | 0 | 1 | 1 | 0 | 1 | 0 | 0 | 0 | 0x68 |
| Data [16] | 0 | 1 | 0 | 1 | 0 | 0 | 0 | 1 | 0x51 |
| Data [17] | 0 | 1 | 0 | 1 | 0 | 0 | 1 | 0 | 0x52 |
| Data [18] | 0 | 1 | 0 | 1 | 0 | 1 | 0 | 0 | 0x54 |
| Data [19] | 0 | 1 | 0 | 1 | 1 | 0 | 0 | 0 | 0x58 |
| Data [20] | 0 | 0 | 1 | 1 | 0 | 0 | 0 | 1 | 0x31 |
| Data [21] | 0 | 0 | 1 | 1 | 0 | 0 | 1 | 0 | 0x32 |
| Data [22] | 0 | 0 | 1 | 1 | 0 | 1 | 0 | 0 | 0x34 |
| Data [23] | 0 | 0 | 1 | 1 | 1 | 0 | 0 | 0 | 0x38 |
| Data [24] | 1 | 1 | 1 | 1 | 1 | 0 | 0 | 0 | 0xF8 |
| Data [25] | 0 | 1 | 0 | 0 | 1 | 1 | 1 | 1 | 0x4F |
| Data [26] | 0 | 1 | 1 | 1 | 0 | 0 | 0 | 0 | 0x70 |
| Data [27] | 1 | 1 | 0 | 1 | 0 | 0 | 0 | 0 | 0xD0 |
| Data [28] | 0 | 0 | 0 | 0 | 1 | 1 | 1 | 0 | 0x0E |
| Data [29] | 0 | 0 | 0 | 0 | 1 | 0 | 1 | 1 | 0x0B |
| Data [30] | 1 | 1 | 1 | 1 | 0 | 0 | 0 | 1 | 0xF1 |
| Data [31] | 0 | 0 | 1 | 0 | 1 | 1 | 1 | 1 | 0x2F |
| Data [32] | 0 | 0 | 0 | 1 | 1 | 1 | 0 | 0 | 0x1C |
| Data [33] | 0 | 0 | 1 | 0 | 1 | 1 | 0 | 0 | 0x2C |
| Data [34] | 0 | 1 | 0 | 0 | 1 | 1 | 0 | 0 | 0x4C |
| Data [35] | 1 | 0 | 0 | 0 | 1 | 1 | 0 | 0 | 0x8C |
| Data [36] | 0 | 0 | 0 | 1 | 1 | 0 | 1 | 0 | 0x1A |
| Data [37] | 0 | 0 | 1 | 0 | 1 | 0 | 1 | 0 | 0x2A |
| Data [38] | 0 | 1 | 0 | 0 | 1 | 0 | 1 | 0 | 0x4A |
| Data [39] | 1 | 0 | 0 | 0 | 1 | 0 | 1 | 0 | 0x8A |
| Data [40] | 0 | 0 | 0 | 1 | 1 | 0 | 0 | 1 | 0x19 |
| Data [41] | 0 | 0 | 1 | 0 | 1 | 0 | 0 | 1 | 0x29 |
| Data [42] | 0 | 0 | 1 | 0 | 1 | 0 | 0 | 1 | 0x49 |
| Data [43] | 1 | 0 | 0 | 0 | 1 | 0 | 0 | 1 | 0x89 |
| Data [44] | 0 | 0 | 0 | 1 | 0 | 1 | 1 | 0 | 0x16 |
| Data [45] | 0 | 0 | 1 | 0 | 0 | 1 | 1 | 0 | 0x26 |
| Data [46] | 0 | 1 | 0 | 0 | 0 | 1 | 1 | 0 | 0x46 |
| Data [47] | 1 | 0 | 0 | 0 | 0 | 1 | 1 | 0 | 0x86 |
| Data [48] | 0 | 0 | 0 | 1 | 0 | 1 | 0 | 1 | 0x15 |
| Data [49] | 0 | 0 | 1 | 0 | 0 | 1 | 0 | 1 | 0x25 |
| Data [50] | 0 | 1 | 0 | 0 | 0 | 1 | 0 | 1 | 0x45 |
| Data [51] | 1 | 0 | 0 | 0 | 0 | 1 | 0 | 1 | 0x85 |
| Data [52] | 0 | 0 | 0 | 1 | 0 | 0 | 1 | 1 | 0x13 |
| Data [53] | 0 | 0 | 1 | 0 | 0 | 0 | 1 | 1 | 0x23 |
| Data [54] | 0 | 1 | 0 | 0 | 0 | 0 | 1 | 1 | 0x43 |
| Data [55] | 1 | 0 | 0 | 0 | 0 | 0 | 1 | 1 | 0x83 |
| Data [56] | 1 | 0 | 0 | 0 | 1 | 1 | 1 | 1 | 0x8F |
| Data [57] | 1 | 1 | 1 | 1 | 0 | 1 | 0 | 0 | 0xF4 |
| Data [58] | 0 | 0 | 0 | 0 | 0 | 1 | 1 | 1 | 0x07 |
| Data [59] | 0 | 0 | 0 | 0 | 1 | 1 | 0 | 1 | 0x0D |
| Data [60] | 1 | 1 | 1 | 0 | 0 | 0 | 0 | 0 | 0xE0 |
| Data [61] | 1 | 0 | 1 | 1 | 0 | 0 | 0 | 0 | 0xB0 |
| Data [62] | 0 | 0 | 0 | 1 | 1 | 1 | 1 | 1 | 0x1F |
| Data [63] | 1 | 1 | 1 | 1 | 0 | 0 | 1 | 0 | 0xF2 |
| ECC [0] | 0 | 0 | 0 | 0 | 0 | 0 | 0 | 1 | 0x00 |
| ECC [1] | 0 | 0 | 0 | 0 | 0 | 0 | 1 | 0 | 0x02 |
| ECC [2] | 0 | 0 | 0 | 0 | 0 | 1 | 0 | 0 | 0x04 |

TABLE 16-continued

| Bits | S [7] | S [6] | S [5] | S [4] | S [3] | S [2] | S [1] | S [0] | Syndrome Code S [7:0] |
|---|---|---|---|---|---|---|---|---|---|
| ECC [3] | 0 | 0 | 0 | 0 | 1 | 0 | 0 | 0 | 0x08 |
| ECC [4] | 0 | 0 | 0 | 1 | 0 | 0 | 0 | 0 | 0x10 |
| ECC [5] | 0 | 0 | 1 | 0 | 0 | 0 | 0 | 0 | 0x20 |
| ECC [6] | 0 | 1 | 0 | 0 | 0 | 0 | 0 | 0 | 0x40 |
| ECC [7] | 1 | 0 | 0 | 0 | 0 | 0 | 0 | 0 | 0x80 |

The receiving computer module detects a multiple-bit error when a three-bit or a four-bit error occurs or when a double-bit error occurs. The receiving computer module detects a double-bit error when the parity of the syndrome bit S [7:0] is even and the syndrome bits are not equal to zero. When the receiver detects a multiple-bit error, it may set the multiple-bit error bit in an error status register. The receiving computer module typically cannot correct data or ECC bits when a multiple bit error occurs.

The receiving computer module may detect a three-bit or a four-bit error when either of the following conditions occur: 1) syndrome bits S [3:0] are not equal to zero and syndrome bits S [7:4] are equal to 0x7, 0xB, 0xD, or 0xE, indicating that three bits are set to one; or (2) syndrome bits S [7:4] are not equal to zero and syndrome bits S [3:0] are equal to 0x7, 0xB, 0xD, or 0xE, indicating that three bits are set to one. When the receiving computer module detects a three-bit or a four-bit error, it may set the multiple-bit error bit in the error status register.

As mentioned previously, in particular embodiments, remote computer module (RCM) 30 has memory-mapped registers. These registers may be accessed by host computer module (HCM) 20 by, for example, using PIO Read transactions or PIO Write transactions.

In certain embodiments, the memory-mapped registers are accessible by host computer module 20 using PIO 8-byte Read or PIO 8-byte Write transactions. These registers are accessed using the 56-bit Coretalk memory address space. The register addresses are on 8-byte boundaries, so bits [2:0] of the register addresses are zero. In addition, the byte-enable field of PIO 8-byte Read Request messages and PIO 8-byte Write Request messages should be 0xFF to access the registers. In particular embodiments, at least the lower 256-bytes of the Coretalk address space in a remote computer module is reserved for configuration and status registers.

Table 17 lists the registers that a remote computer module in compliance with the Coretalk standard may provide to conform with correct operation of the bus. Details on the fields used in these registers is provided below.

TABLE 17

| Register Name | Register Address |
|---|---|
| CM_ID | 0x00_0000_0000_0000 |
| CM_STATUS | 0x00_0000_0000_0008 |
| CM_ERROR_STATUS | 0x00_0000_0000_0060 |
| CM_CLEAR_ERROR_STATUS | 0x00_0000_0000_0068 |
| CM_ERROR_DETAIL_1 | 0x00_0000_0000_0010 |
| CM_ERROR_DETAIL_2 | 0x00_0000_0000_0018 |
| CM_INTERRUPT_ENABLE | 0x00_0000_0000_0070 |
| CM_INTERRUPT_DEST | 0x00_0000_0000_0038 |
| CM_CONTROL | 0x00_0000_0000_0020 |
| CM_REQUEST_TIMEOUT | 0x00_0000_0000_0028 |
| CM_TARGET_FLUSH | 0x00_0000_0000_0050 |
| CM_CACHED_TIMEOUT | 0x00_0000_0000_0080 |

The Coretalk Module Identification (CM_ID) register is a read-only register that contains information that identifies the manufacturer, part number, and revision number of the remote computer module. The CM_ID register may conform to the IEEE 1149.1 JTAG Device Identification Register standard. Table 18 illustrates the fields of the register.

TABLE 18

| Bits | Access | Reset Value | Field Name |
|---|---|---|---|
| 0 | RO | 1 | READ_AS_ONE |
| 11:1 | RO | x | MANUFACTURER |
| 27:12 | RO | x | PART_NUMBER |
| 31:28 | RO | x | REVISION_NUMBER |
| 63:32 | RO | 0 | RESERVED |

The fields are defined as follows:
READ_AS_ONE—This field is not used and when read, always returns a one;
MANUFACTURER—This field contains an eleven-bit value that identifies the manufacturer of the RCM;
PART_NUMBER—This field contains a sixteen-bit value that identifies the part number of the RCM;
REVISION_NUMBER—This field contains a four-bit value that identifies the revision of the RCM; and
RESERVED—These bits are reserved for future use.

The Coretalk Module Status (CM_STATUS) register is a read-only register that contains information on the current status of credit counters and the number of pending read and write requests issued by the remote computer module. Table 19 illustrates the fields of the register.

TABLE 19

| Bits | Access | Reset Value | Field Name |
|---|---|---|---|
| 5:0 | RO | 0 | PENDING_READS |
| 7:6 | RO | x | RESERVED |
| 12:8 | RO | 0 | PENDING_WRITES |
| 15:13 | RO | x | RESERVED |
| 23:16 | RO | x | HCM_RSP_CREDITS |
| 31:24 | RO | x | HCM_REQ_CREDITS |
| 35:32 | RO | x | CM_REQ_CREDITS |
| 63:36 | RO | x | CM_DEFINED |

The fields are defines as follows:
PENDING_READS—This field indicates the number of read request messages transmitted by the RCM for which the HCM has not yet transmitted a corresponding read response message (Read request messages include: Memory 8-byte Read Request.

Messages—Get; Cached, Not Timed; or Cached Timed); Memory 128-byte Read Request Messages—Get; Cached, Not Timed; or Cached Timed); PIO 8-byte Read Request Messages; PIO Full 128-byte Read Request Messages; and Fetch AMO Request Messages.);

RESERVED—These bits are reserved for future use;
PENDING_WRITES—This field indicates the number of write request messages transmitted by the RCM for which the HCM has not yet transmitted a corresponding write response message (Write request messages include: Memory Full 128-byte Write Request Messages; Memory Partial 128-byte Write Request Messages; PIO 8-byte Write Request Messages; PIO Partial 128-byte Write Request Messages; and Store AMO Request Messages.);

RESERVED—These bits are reserved for future use;
HCM_RSP_CREDITS—This field indicates the number of response credits that the RCM has received from the HCM (The HCM uses the Response Credit signal to indicate to the RCM that the HCM has room in its response buffer for another individual 128-bit FLIT of a response message; thus, this field indicates the number of 128-bit response message FLITS that the RCM may send to the HCM.);

HCM_REQ_CREDITS—This field indicates the number of request credits that the RCM has received from the HCM (The HCM uses the Request Credit signal to indicate to the RCM that the HCM has room in its request buffer for another individual 128-bit FLIT of a request message; thus, this field indicates the number of 128-bit request message flits that the RCM may send to the HCM.);

CM_REQ_CREDITS—This field indicates the number of request credits that the RCM has sent to the HCM (The RCM uses the Request Credit signal to indicate to the HCM that the RCM has room in its request buffer for another complete request message; thus, this field indicates the number of complete request messages that the HCM may send to the RCM.); and CM_DEFINED—These bits are defined by the designer of the RCM.

The Coretalk Module Error Status (CM_ERROR_STATUS) register is a readable and writable register that indicates when specific bus errors have occurred. The CM_ERROR_STATUS register should not be modified by a reset. Writing to the CM_ERROR_STATUS register overwrites all values in the register. Writing to the CM_CLEAR_ERROR_STATUS register clears individual bits in the CM_ERROR_STATUS register without affecting the other bits in the register. Table 20 illustrates the fields of the register.

TABLE 20

| Bits | Access | Reset Value | Field Name |
| --- | --- | --- | --- |
| 0 | RW | x | ECC_SBE |
| 1 | RW | x | ECC_MBE |
| 2 | RW | x | UNSUPPORTED_REQ |
| 3 | RW | x | UNEXPECTED_RSP |
| 4 | RW | x | BAD_LENGTH |
| 5 | RW | x | BAD_DATAVALID |
| 6 | RW | x | BUFFER_OVERFLOW |
| 7 | RW | x | REQUEST_TIMEOUT |
| 16:8 | RW | x | RESERVED |
| 63:17 | RW | x | CM_DEFINED |

The fields are defined as follows:

ECC_SBE—When equal to one, this bit indicates that the RCM detected a single-bit error on the bus using the ECC that it received on the ECC [7:0] signals;

ECC_MBE—When equal to one, this bit indicates that the RCM detected a multiple-bit error on the bus using the ECC that it received on the ECC [7:0] signals;

UNSUPPORTED_REQ—When equal to one, this bit indicates that the RCM received a request message that the RCM does not support (For example, if the RCM received a Fetch AMO Request message, the RCM would set this bit to one; more information on the request message that caused the error is provided in the CM_ERROR_DETAIL_1 and CM_ERROR_DETAIL_2 registers.);

UNEXPECTED_RSP—When equal to one, this bit indicates that the RCM received a response message that the RCM was not expecting (More information on the response message that caused the error is provided in the CM_ERROR_DETAIL_1 and CM_ERROR_DETAIL_2 registers.);

BAD_LENGTH—When equal to one, this bit indicates that the RCM received a message in which the number of FLITS did not match the correct number of flits for that message type (More information on the message that caused the error is provided in the CM_ERROR_DETAIL_1 and CM_ERROR_DETAIL_2 registers.);

BAD_DATAVALID—When equal to one, this bit indicates that the RCM detected that the Request Valid and Response Valid signals were asserted at the same time on the bus;

BUFFER_OVERFLOW—When equal to one, this bit indicates that the RCM received more request messages than it has room for in its request buffer (The RCM asserts the request credit signal once for each request message that it can receive from the HCM. If the HCM sends more request messages than the number of request credits the RCM generated, the RCM sets this bit to one; more information on the message that caused the error is provided in the CM_ERROR_DETAIL_1 and CM_ERROR_DETAIL_2 registers);

REQUEST_TIMEOUT—When equal to one, this bit indicates that the RCM sent a request message for which it did not receive a corresponding response message before a time-out counter expired (The value of the time-out counter is specified in the CM_REQUEST_TIMEOUT register.);

RESERVED—This bits are reserved for future use; and

CM_DEFINED—These bits are defined by the designer of the RCM.

The Coretalk Module Clear Error Status (CM_CLEAR_ERROR_STATUS) register is a readable and writable register that clears individual bits in the CM_ERROR_STATUS register. When the CM_CLEAR_ERROR_STATUS register is read, the value of each bit is zero. Table 21 illustrates the fields of the register.

TABLE 21

| Bits | Access | Reset Value | Field Name |
| --- | --- | --- | --- |
| 0 | RW | x | CLEAR_ECC_SBE |
| 1 | RW | x | CLEAR_ECC_MBE |
| 2 | RW | x | CLEAR_UNSUPPORTED_REQ |
| 3 | RW | x | CLEAR_UNEXPECTED_RSP |
| 4 | RW | x | CLEAR_BAD_LENGTH |
| 5 | RW | x | CLEAR_BAD_DATAVALID |
| 6 | RW | x | CLEAR_BUFFER_OVERFLOW |
| 7 | RW | x | CLEAR_REQUEST_TIMEOUT |
| 16:8 | RW | x | RESERVED |
| 63:17 | RW | x | CLEAR_CM_DEFINED |

The fields are defined as follows:

CLEAR_ECC_SBE—When this bit is one, the RCM clears the ECC_SBE bit in the CM_ERROR_STATUS register, but when the CLEAR_ECC_SBE bit is zero, the value of the ECC_SBE bit is not changed;

CLEAR_ECC_MBE—When this bit is one, the RCM clears the ECC_MBE bit in the CM_ERROR_STATUS register, but when the CLEAR_ECC_MBE bit is zero, the value of the ECC_MBE bit is not changed;

CLEAR_UNSUPPORTED_REQ—When this bit is one, the RCM clears the UNSUPPORTED_REQ bit in the CM_ERROR_STATUS register and the VALID bit in the CM_ERROR_DETAIL_1 register (This action re-enables the capture of error details in the CM_ERROR_DETAIL_1 and CM_ERROR_DETAIL_2 registers, but when the this bit is zero, the value of the UNSUPPORTED_REQ bit is not changed.);

CLEAR_UNEXPECTED_RSP—When this bit is one, the RCM clears the UNEXPECTED_RSP bit in the CM_ERROR_STATUS register and the VALID bit in the CM_ERROR_DETAIL_1 register (This action re-enables the capture of error details in the CM_ERROR_DETAIL_1 and CM_ERROR_DETAIL_2 registers, but when this bit is zero, the value of the UNEXPECTED_RSP bit is not changed.);

CLEAR_BAD_LENGTH—When this bit is one, the RCM clears the BAD_LENGTH bit in the CM_ERROR_STATUS register and the VALID bit in the CM_ERROR_DETAIL_1 register (This action re-enables the capture of error details in the CM_ERROR_DETAIL_1 and CM_ERROR_DETAIL_2 registers, but when this bit is zero, the value of the BAD_LENGTH bit is not changed.);

CLEAR_BAD_DATAVALID—When this bit is one, the RCM clears the BAD_DATAVALID bit in the CM_ERROR_STATUS register (When this bit is zero, however, the value of the BAD_DATAVALID bit is not changed.);

CLEAR_BUFFER_OVERFLOW—When this bit is one, the RCM clears the BUFFER_OVERFLOW bit in the CM_ERROR_STATUS register and the VALID bit in the CM_ERROR_DETAIL_1 register (This action re-enables the capture of error details in the CM_ERROR_DETAIL_1 and CM_ERROR_DETAIL_2 registers, but when this bit is zero, the value of the BUFFER_OVERFLOW bit is not changed.);

CLEAR_REQUEST_TIMEOUT—When this bit is one, the RCM clears the REQUEST_TIMEOUT bit in the CM_ERROR_STATUS register (When this bit is zero, however, the value of the REQUEST_TIMEOUT bit is not changed.);

RESERVED—This bits are reserved for future use; and

CLEAR_CM_DEFINED—When a bit in this field is one, the RCM clears the corresponding bit in the CM_DEFINED field of the CM_ERROR_STATUS register (When a bit in this is zero, however, the corresponding bit in the CM_DEFINED field of the CM_ERROR_STATUS register is not changed.).

The Coretalk Module Error Detail 1 (CM_ERROR_DETAIL_1) register is a read-only register that stores the message head fields from the first message that caused an UNSUPPORTED_REQ, UNEXPECTED_RSP, BAD_LENGTH, or BUFFER_OVERFLOW error reported in the CM_ERROR_STATUS register. The CM_ERROR_DETAIL_1 register should not be modified by a reset. Table 22 illustrates the fields for this register.

TABLE 22

| Bits | Access | Reset Value | Field Name |
| --- | --- | --- | --- |
| 3:0 | RO | x | MESSAGE_TYPE |
| 5:4 | RO | x | SOURCE_ID |
| 7:6 | RO | x | DATA_SIZE |
| 15:8 | RO | x | TNUM |
| 23:16 | RO | x | BYTE_ENABLE |
| 31:24 | RO | x | GFX_CRED |
| 33:32 | RO | x | READ_TYPE |
| 34 | RO | x | PIO_OR_MEMORY |
| 35 | RO | x | HEAD_CW_ERROR |
| 47:36 | RO | x | RESERVED |
| 48 | RO | x | HEAD_ERROR_BIT |
| 49 | RO | x | DATA_ERROR_BIT |
| 62:50 | RO | x | RESERVED |
| 63 | RO | x | VALID |

The fields are defined as follows:

MESSAGE_TYPE—When the VALID bit is one, this field contains the value of the Message Type field in the command word of the first message to cause an error bit in the CM_ERROR_STATUS register to set;

SOURCE_ID—When the VALID bit is one, this field contains the value of the Source ID field in the command word of the first message to cause an error bit in the CM_ERROR STATUS register to set;

DATA_SIZE—When the VALID bit is one, this field contains the value of the Data Size field in the command word of the first message to cause an error bit in the CM_ERROR_STATUS register to set;

TNUM—When the VALID bit is one, this field contains the value of the Transaction Number field in the command word of the first message to cause an error bit in the CM_ERROR_STATUS register to set;

BYTE_ENABLE—When the VALID bit is one, this field contains the value of the Byte Enable field in the head of the first message to cause an error bit in the CM_ERROR_STATUS register to set (The Byte Enable field is not valid for all message types.);

GFX_CRED—When the VALID bit is one, this field contains the value of the Graphics Credit field in the head of the first message to cause an error bit in the CM_ERROR_STATUS register to set (The Graphics Credit field is not valid for all message types.);

READ_TYPE—When the VALID bit is one, this field contains the value of the Read Type field in the command word of the first message to cause an error bit in the CM_ERROR_STATUS register to set (The Read Type field is not valid for all message types.);

PIO_OR_MEMORY—When the VALID bit is one, this bit contains the value of the PIO Transaction bit in the command word of the first message to cause an error bit in the CM_ERROR_STATUS register to set;

HEAD_CW_ERROR—When the VALID bit is one, this bit contains the value of the Error bit in the command word of the first message to cause an error bit in the CM_ERROR_STATUS register to set;

RESERVED—These bits are reserved for future use;

HEAD_ERROR_BIT—When the VALID bit is one, this bit contains the value of the Error signal for the message head when the RCM received the message;

DATA_ERROR_BIT—When the VALID bit is one, this bit contains the value of the Error signal for the message data payload when the RCM received the message;

RESERVED—These bits are reserved for future use; and

VALID—When this bit is one, it indicates that the CM_ERROR_DETAIL_1 and CM_ERROR_DETAIL_2 registers contain the message head information for the first message to cause an error bit in the CM_ERROR_STATUS register to set, and when this bit is zero, it indicates that the CM_ERROR_DETAIL_1 and CM_ERROR_DETAIL_2 registers are enabled, but do not contain valid message head information.

The Coretalk Module Error Detail 2 (CM_ERROR_DETAIL_2) register is a read-only register that stores the address field from the first message that causes an UNSUPPORTED_REQ, UNEXPECTED_RSP, BAD_LENGTH, or BUFFER_OVERFLOW error reported in the CM_ERROR_STATUS register. The CM_ERROR_DETAIL_2 register should not be modified by a reset. Table 23 illustrates the fields for this register.

TABLE 23

| Bits | Access | Reset Value | Field Name |
| --- | --- | --- | --- |
| 55:0 | RO | x | ADDRESS |
| 63:56 | RO | x | RESERVED |

The fields for this register are defined as follows:

ADDRESS—When the VALID bit of the CM_ERROR_DETAIL_1 register is one, this field contains the value of the Address field of the first message to cause an error bit in the CM_ERROR_STATUS register to set (The Address field is not valid for all message types.); and RESERVED—These bits are reserved for future used.

The Coretalk Module Interrupt Enable (CM_INTERRUPT_ENABLE) register is a readable and writable register that enables the generation of an interrupt message when selected errors are reported in the CM_ERROR_STATUS register. The interrupt message is a PIO 8-byte Write Request message that the remote computer module sends to a processor in the computer system that is designated to handle interrupts. The address for the interrupt message is defined in the CM_INTERRUPT_DEST register. Table 24 illustrates the fields for this register.

TABLE 24

| Bits | Access | Reset Value | Field Name |
|---|---|---|---|
| 0 | RW | 0 | ENABLE_ECC_SBE |
| 1 | RW | 0 | ENABLE_ECC_MBE |
| 2 | RW | 0 | ENABLE_UNSUPPORTED_REQ |
| 3 | RW | 0 | ENABLE_UNEXPECTED_RSP |
| 4 | RW | 0 | ENABLE_BAD_LENGTH |
| 5 | RW | 0 | ENABLE_BAD_DATAVALID |
| 6 | RW | 0 | ENABLE_BUFFER_OVERFLOW |
| 7 | RW | 0 | ENABLE_REQUEST_TIMEOUT |
| 16:8 | RW | 0 | RESERVED |
| 63:17 | RW | 0 | ENABLE_CM_DEFINED |

The fields for this register are defined as follows:

ENABLE_ECC_SBE—When this bit is one, the RCM generates an interrupt message when the ECC_SBE bit in the CM_ERROR_STATUS register changes from zero to one;

ENABLE_ECC_MBE—When this bit is one, the RCM generates an interrupt message when the ECC_MBE bit in the CM_ERROR_STATUS register changes from zero to one;

ENABLE_UNSUPPORTED_REQ—When this bit is one, the RCM generates an interrupt message when the UNSUPPORTED_REQ bit in the CM_ERROR_STATUS register changes from zero to one;

ENABLE_UNEXPECTED_RSP—When this bit is one, the RCM generates an interrupt message when the UNEXPECTED_RSP bit in the CM_ERROR_STATUS register changes from zero to one;

ENABLE_BAD_LENGTH—When this bit is one, the RCM generates and interrupt message when the BAD_LENGTH bit in the CM_ERROR_STATUS register changes from zero to one;

ENABLE_BAD_DATAVALID—When this bit is one, the RCM generates an interrupt message when the BAD_DATAVALID bit in the CM_ERROR_STATUS register changes from zero to one;

ENABLE_BUFFER_OVERFLOW—When this bit is one, the RCM generates an interrupt message when the BUFFER_OVERFLOW bit in the CM_ERROR_STATUS register changes from zero to one;

ENABLE_REQUEST_TIMEOUT—When this bit is one, the RCM generates an interrupt message when the REQUEST_TIMEOUT bit in the CM_ERROR_STATUS register changes from zero to one;

RESERVED—This bits are reserved for future use; and

ENABLE_CM_DEFINED—When a bit in this field is one, the RCM generates an interrupt message when the corresponding bit in the CM_DEFINED field of the CM_ERROR_STATUS register changes from zero to one.

The Coretalk Module Interrupt Destination (CM_INTERRUPT_DEST) register is a readable and writable register that contains an address used for interrupt messages. An interrupt message is a PIO 8-byte Write Request message that the remote computer module sends to a processor interface in the computer system that is designated to handle interrupts. Table 25 illustrates the fields for this register.

TABLE 25

| Bits | Access | Reset Value | Field Name |
|---|---|---|---|
| 55:0 | RW | x | ADDRESS |
| 63:56 | RW | x | INT_VECTOR |

The fields for this register are defined as follows:

ADDRESS—This field contains the 56-bit address used in the Address field of interrupt messages (Interrupt messages are PIO 8-byte Write Request messages that the RCM sends to a processor interface in the computer system.); and INT_VECTOR—This field contains an interrupt vector for the processor interface that is designated to handle interrupts.

The Coretalk Module Control (CM_CONTROL) register is a readable and writable register that sets various identification and configuration parameters for the remote computer module. Table 26 illustrates the fields for this register.

TABLE 26

| Bits | Access | Reset Value | Field Name |
|---|---|---|---|
| 1:0 | RW | 0x3 | CM_ID |
| 3:2 | RW | x | RESERVED |
| 10:4 | RW | Refer to Description | MAX_TRANS |
| 11 | RW | x | RESERVED |
| 12 | RW | 0x1 | ADDRESS_MODE |
| 15:13 | RW | x | RESERVED |
| 16 | RW | 0x0 | FORCE_ECC_SBE |
| 17 | RW | 0x0 | FORCE_ECC_MBE |
| 19:18 | RW | x | RESERVED |
| 27:20 | RW | Refer to Description | CREDIT_LIMIT |
| 31:21 | RW | x | RESERVED |
| 63:32 | RW | x | CM_DEFINED |

The fields for this register are defined as follows:

CM_ID—This field contains a value used for the Source ID field in the command word of messages sent by the RCM to the HCM;

RESERVED—These bits are reserved for future use;

MAX_TRANS—This field contains a value that indicates the maximum number of outstanding transactions that the RCM will allow (An outstanding transaction occurs when the RCM has not received a corresponding response message to a request message; when the number of outstanding transactions equals the value in this field, the RCM does not create new request messages until the number of outstanding transactions decreases; the reset value of this field should be the maximum number of outstanding transactions the RCM will allow.);

RESERVED—This bit is reserved for future use;

ADDRESS_MODE—This bit indicates the addressing mode that the computer system uses to address memory (When zero, the addressing mode is Little Endian, and when one, the addressing mode is Big Endian.);

RESERVED—These bits are reserved for future use;

FORCE_ECC_SBE—When this bit is one, the RCM generates ECC for the next bus transaction that will cause the HCM to detect a single-bit error (After generating the single-bit error ECC one time, the RCM returns to normal bus operation.);

FORCE_ECC_MBE—When this bit is one, the RCM generates ECC for the next bus transaction that will cause the HCM to detect a multiple-bit error (After generating the multiple-bit error ECC one time, the RCM returns to normal bus operation.);

RESERVED—These bits are reserved for future use;

CREDIT_LIMIT—This field contains a value that indicates the maximum number of request credits that the RCM will send to the HCM (The reset value of this field should be the maximum number of request credits that the HCM can receive.);

RESERVED—These bits are reserved for future use; and

CM_DEFINED—These bits are defined by the designer of the RCM. The Coretalk Module Request Timeout (CM_REQUEST_TIMEOUT) register is a readable and writable register that contains a maximum value for request time-out counters in the RCM. The RCM should have a prescaler that generates a pulse on the order of 1.00 to 1.28 microseconds that decrements the request time-out counters. Table 27 illustrates the fields for this register.

TABLE 27

| Bits | Access | Reset Value | Field Name |
|---|---|---|---|
| 23:0 | RW | 0xFFFFFF | TIME_OUT |
| 63:24 | RW | x | RESERVED |

The fields are defined as follows:

TIME_OUT—When this field is zero, the request time-out counter in the RCM is disabled, and when this field is greater than zero, the request time-out counter in the RCM is enabled. (When enabled, the time-out counter is a free-running counter that repeatedly counts from zero to the TIME_OUT value; each time the counter restarts at zero, all outstanding requests are marked, and if an outstanding request is already marked when the counter restarts at zero, that request is considered to have timed out; the actual time-out period for an outstanding request depends on when the request is created; if the request is created when the time-out counter is at the TIME_OUT value, the request will time out in the minimum amount of time, which is the TIME_OUT value; if the request is created when the time-out counter is zero, the request will timeout in the maximum amount of time, which is twice the TIME_OUT value; when a request transaction times out, the RCM sets the REQUEST_TIMEOUT bit in the CM_ERROR_STATUS register to one; if enabled by the CM_INTERRUPT_ENABLE register, the RCM also generates an interrupt message and sends the message to a processor interface in the computer system that is designed to handle interrupts; if the RCM receives the corresponding response message after indicating a REQUEST_TIMEOUT error, the RCM reports an UNEXPECTED_RSP error in the CM_ERROR_STATUS register.); and Reserved—These bits are reserved for future use.

The Coretalk Module Target Flush (CM_TARGET_FLUSH) register is a read-only register that indicates when the RCM has completed the transactions for all of the request messages that it received. This register is required in RCMs that support pipelining of transactions. Table 28 illustrates the fields for this register.

TABLE 28

| Bits | Access | Reset Value | Field Name |
|---|---|---|---|
| 63:0 | RO | 0 | TARGET_FLUSH_VALUE |

The field is defined as follows:

TARGET_FLUSH_VALUE—When this field is zero, it indicates that the RCM has completed the transactions for all of the request messages that it received, and when this field is not zero, it indicates that the RCM is still processing transactions for one or more request messages that it received.

The Coretalk Module Cached Time-out (CM_CACHED_TIMEOUT) register is a readable and writable register that controls the frequency at which the cached-timed read-request timeout counter increments. The RCM and the HCM have memory-mapped registers that control the duration of the cached-timed read-request timeout. When the RCM issues a cached-timed read-request to the HCM, it notes the current value of its free-running counter. The RCM detects a timeout condition when data from a cached-time read-request has been in the cache memory of the RCM longer than the time-out period. When data for a cached-timed read-request transaction times out, the RCM marks the data in cache memory as invalid. Table 29 illustrates the fields for this register.

TABLE 29

| Bits | Access | Reset Value | Field Name |
|---|---|---|---|
| 11:0 | RW | 0x0 | TIMER_DIV |
| 12 | RW | 0x0 | TIMER_EN |
| 21:13 | RW | 0x0 | TIMER_CUR |
| 63:22 | RO | x | RESERVED |

The fields are defined as follows:

TIMER_DIV—This field controls the frequency at which the cached-timed read-request timer increments (The 400 MHz channel clock is divided by 128 as a fixed prescaler and then again by the programmable TIMER_DIV value; the increment value of the cached-timed read-request timeout counter is 400 MHz/128/(TIMER_DIV+1).);

TIMER_EN—When this bit is one, the cached-timed read-request timer is enabled, and when this bit is zero, the cached-timed read-request timer is disabled;

TIMER_CUR—This field is a read-only field that contains the current value of the cached-timed read-request timeout counter; and RESERVED—These bits are reserved for future use.

While the present invention has been described using a variety of embodiments, the invention is not intended to be measured thereby, but by the claims that follow. Additionally, those skilled in the art will readily recognize a variety of additions, deletions, substitutions, and transformations that may be made to the illustrated embodiments. Accordingly, the following claims are intended to encompass such additions, deletions, substitutions, and transformations to the extent that they do not do violence to the spirit of the claims.

The invention claimed is:

1. A method for conveying data, comprising:
   determining whether a transaction request credit has been received at a computer module, the transaction request credit indicating that at least a portion of a transaction request message may be sent;
   determining, if a transaction request message is to be sent, whether at least a portion of the transaction request message may be sent in response to the transaction request credit; and
   sending the at least a portion of the transaction request message if the transaction request message is to be sent in accordance with the transaction request credit.

2. The method of claim 1, wherein determining whether a transaction request credit has been received at a computer module comprises determining whether a signal indicative of a transaction request credit has been received.

3. The method of claim 1, wherein determining whether at least a portion of the transaction request message may be sent comprises examining a request credit counter, the request credit counter incremented if a transaction request credit has been received.

4. The method of claim 3, further comprising refusing to increment the request credit counter if a limit has been reached.

5. The method of claim 3, further comprising decrementing the request credit counter when the at least a portion of the transaction request message has been sent.

6. The method of claim 1, wherein sending the at least a portion of the transaction request message comprises sending the at least a portion over a link set, each link conveying a part of the at least a portion of the request message.

7. The method of claim 6, wherein sending the at least a portion over a link set comprises sending each part at a double data rate over the associated link.

8. The method of claim 1, further comprising sending a set of error correction codes associated with the message, wherein the error correction codes may be used to detect and correct single-bit errors, detect double-bit errors, and detect multiple-bit errors.

9. The method of claim 1, further comprising:
sending a transaction request signal associated with the message, the signal indicating that the message is a transaction request message;
sending a message initiation signal associated with the first portion of the message; and
sending a message completion signal associated with the last portion of the message.

10. The method of claim 1, wherein the first portion of the message includes a command word section and a message head section, the command word section indicating the type of bus transaction that the message is requesting.

11. The method of claim 10, wherein the command word section includes an identifier for the transaction so that a response message may be properly associated with the request message.

12. The method of claim 1, further comprising determining whether a transaction response message associated with the transaction request message has been received.

13. The method of claim 1, further comprising:
determining whether a transaction response credit has been received at the computer module, the transaction response credit indicating that at least a portion of a transaction response message may be sent;
determining, if a transaction response message is to be sent, whether at least a portion of the transaction response message may be sent; and
sending the at least a portion of the transaction response message if the transaction request message is to be sent.

14. The method of claim 1, further comprising:
determining, at the computer module, whether at least a portion of a transaction request message may be received; and
sending a transaction request credit if at least a portion of a transaction request message may be received, the transaction request credit indicating that at least a portion of a transaction request message may be sent.

15. The method of claim 1, further comprising:
determining, at the computer module, whether at least a portion of a transaction response message may be received; and
sending a transaction response credit if at least a portion of a transaction response message may be received, the transaction response credit indicating that at least a portion of a transaction response message may be sent.

* * * * *